(12) United States Patent
Moise et al.

(10) Patent No.: US 6,211,035 B1
(45) Date of Patent: Apr. 3, 2001

(54) INTEGRATED CIRCUIT AND METHOD

(75) Inventors: Theodore S. Moise, Los Altos, CA (US); Guoqiang Xing, Plano, TX (US); Mark Visokay, Boise, ID (US); Justin F. Gaynor, San Jose; Stephen R. Gilbert, San Francisco, both of CA (US); Francis Celii, Dallas, TX (US); Scott R. Summerfelt, Cupertino, CA (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/392,988

(22) Filed: Sep. 9, 1999

Related U.S. Application Data

(60) Provisional application No. 60/123,687, filed on Mar. 10, 1999, provisional application No. 60/114,228, filed on Dec. 30, 1998, provisional application No. 60/099,848, filed on Sep. 11, 1998, and provisional application No. 60/099,571, filed on Sep. 9, 1998.

(51) Int. Cl.$^7$ ................................................. H01L 21/20
(52) U.S. Cl. ............................................ 438/396; 438/396
(58) Field of Search ............................ 438/14, 239, 244, 438/253, 393, 396, 437, 723, 9

(56) References Cited

U.S. PATENT DOCUMENTS

| | | | |
|---|---|---|---|
| 5,233,212 | * 8/1993 | Ohi et al. ............................... | 257/390 |
| 5,380,673 | * 1/1995 | Yang et al. ............................. | 437/47 |
| 5,413,950 | * 5/1995 | Chen et al. ............................. | 437/52 |
| 5,567,640 | * 10/1996 | Tseng .................................. | 438/396 |
| 5,807,761 | * 9/1998 | Coronel et al. ......................... | 438/14 |

* cited by examiner

Primary Examiner—David Nelms
Assistant Examiner—David Nhu
(74) Attorney, Agent, or Firm—Carlton H. Hoel; W. James Brady; Frederick J. Telecky, Jr.

(57) ABSTRACT

A via etch to contact a capacitor with ferroelectric between electrodes together with dielectric on an insulating diffusion barrier includes two-step etch with F-based dielectric etch and Cl- and F-based barrier etch.

4 Claims, 28 Drawing Sheets

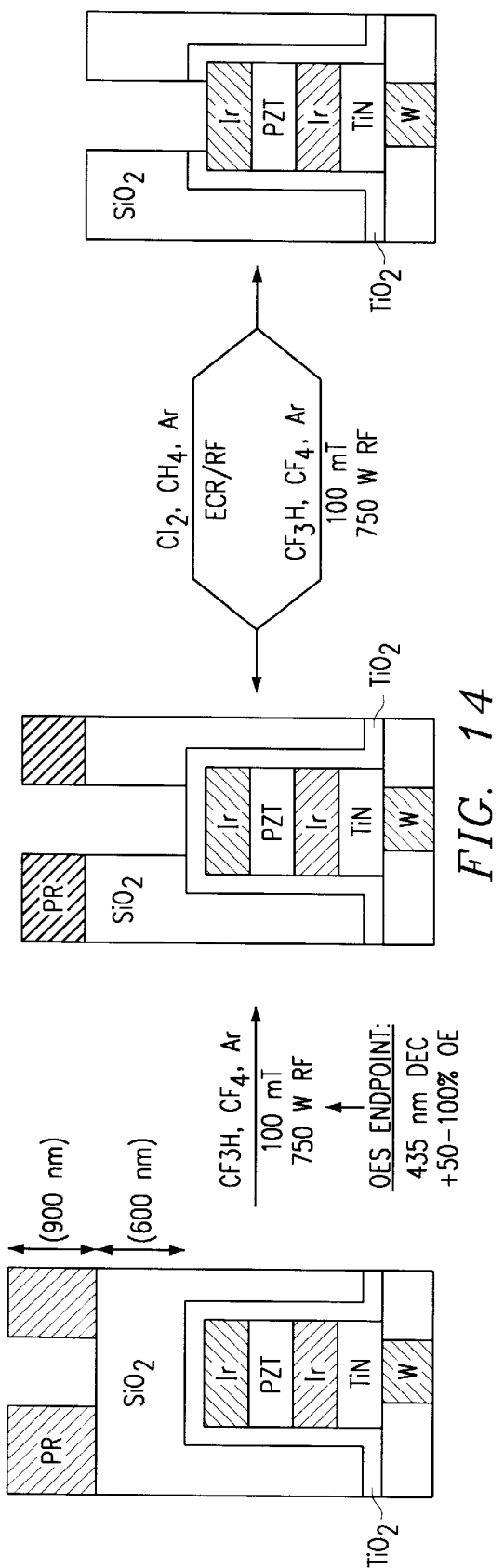
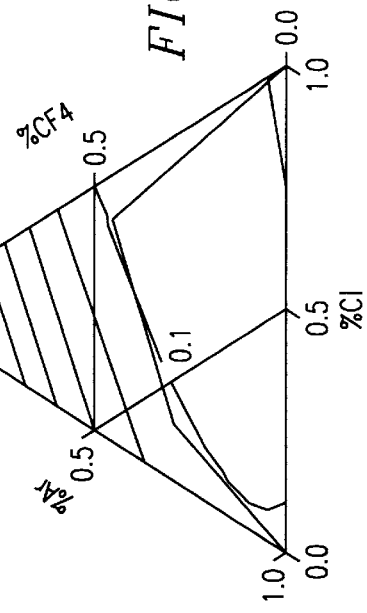
FIG. 14
FIG. 15

INTEGRATED CIRCUIT AND METHOD

RELATED APPLICATIONS

This application claims priority from the following provisional patent applications:

application Ser. No. 60/099,571 filed Sep. 9, 1998 (TI-26586)

application Ser. No. 60/099,848 filed Sep. 11, 1998 (TI-27124)

application Ser. No. 60/114,228 filed Dec. 30, 1998 (TI-28057)

application Ser. No. 60/123,687 filed Mar. 10, 1999 (TI-28589)

Also, application Ser. No. 09/238,211 filed Jan. 27, 1999 and application Ser. No. 09/105,738 filed Jun. 26, 1998 are co-pending applications that disclose related subject matter.

BACKGROUND OF THE INVENTION (a) Field of the Invention

The invention relates to electronic semiconductor devices, and, more particularly, to capacitor and memory structures and fabrication methods for such structures.

(b) Description of the Related Art

High density integrated circuit memories have density dominated by cell size; thus alternative capacitor dielectrics such as high dielectric constant para-electrics for dynamic memory (DRAM) and ferroelectrics for nonvolatile ferroelectric memory (FeRAM) have recently received intense investigation. The para-electrics currently being investigated include barium strontium titanate (BST) and tantalum pentoxide (Ta2O5) and the ferroelectrics include strontium bismuth tantalate (SBT) and lead zirconate titanate (PZT). See for example, Hintermaier et al, Properties of $SrBi_2Ta_2O_5$ Thin Films Grown by MOCVD for High Density FeRAM, 1998 Symp. VLSI Tech. Dig. 56.

However, memories with these new dielectrics have manufacturing problems.

SUMMARY OF THE INVENTION

The present invention provides fabrication for paraelectric and ferroelectric capacitors, and includes multi-step stack etches with remote endpoint detection for step transitions.

This has the advantages of manufacturability for paraelectric and ferroelectric capacitors with metal oxide dielectrics such as PZT, BST, and SBT.

BRIEF DESCRIPTION OF THE DRAWINGS

The drawings are heuristic for clarity.

FIG. 14 shows alternative via etching.

FIG. 15 illustrates etch selectivity.

DESCRIPTION OF THE PREFERRED EMBODIMENTS

Overview

The preferred embodiments provide fabrication methods and structures for ferroelectric and high-dielectric-constant paraelectric integrated circuit capacitors and random access memories including multi-step stack etches of electrodes and dielectric within a single plasma reactor using remote endpoint detection for etch step transitions.

Figure 1A:
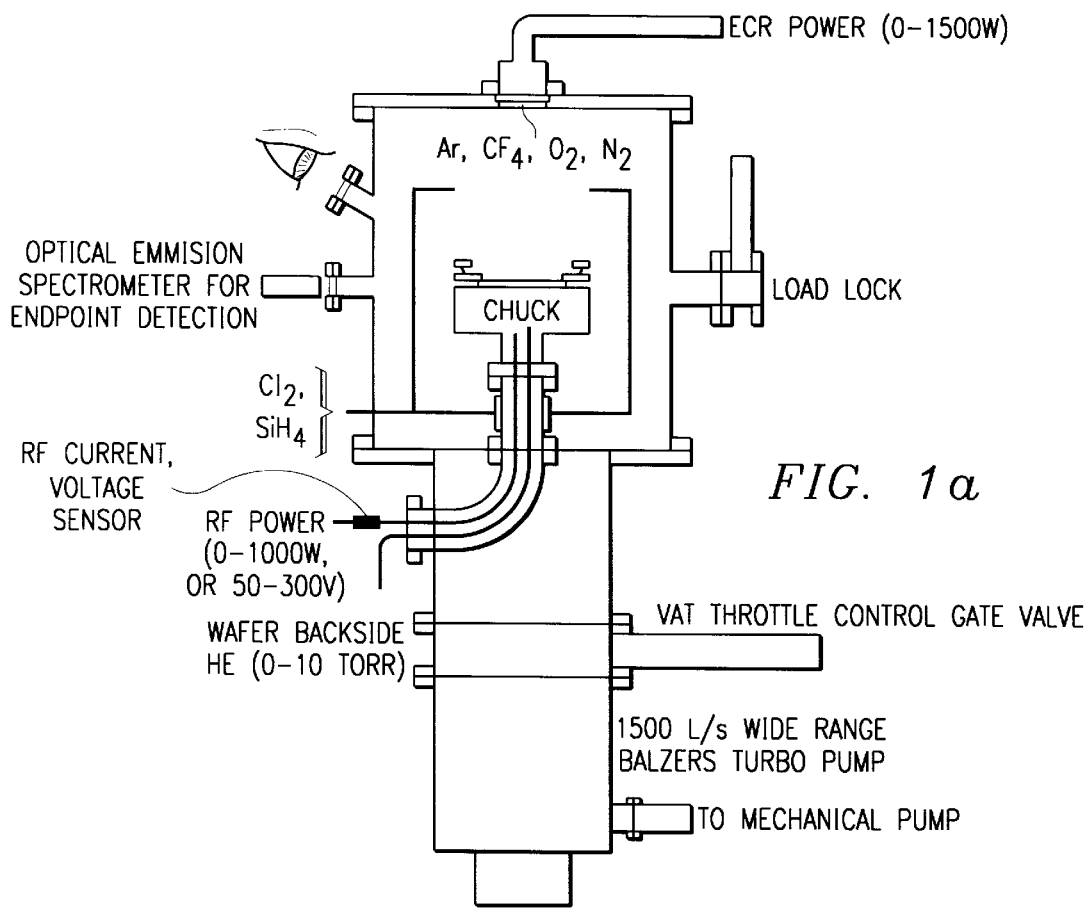
FIGS. 1a–1b illustrates an ECR reactor and RF current and voltage sensor.
Figure 1B:
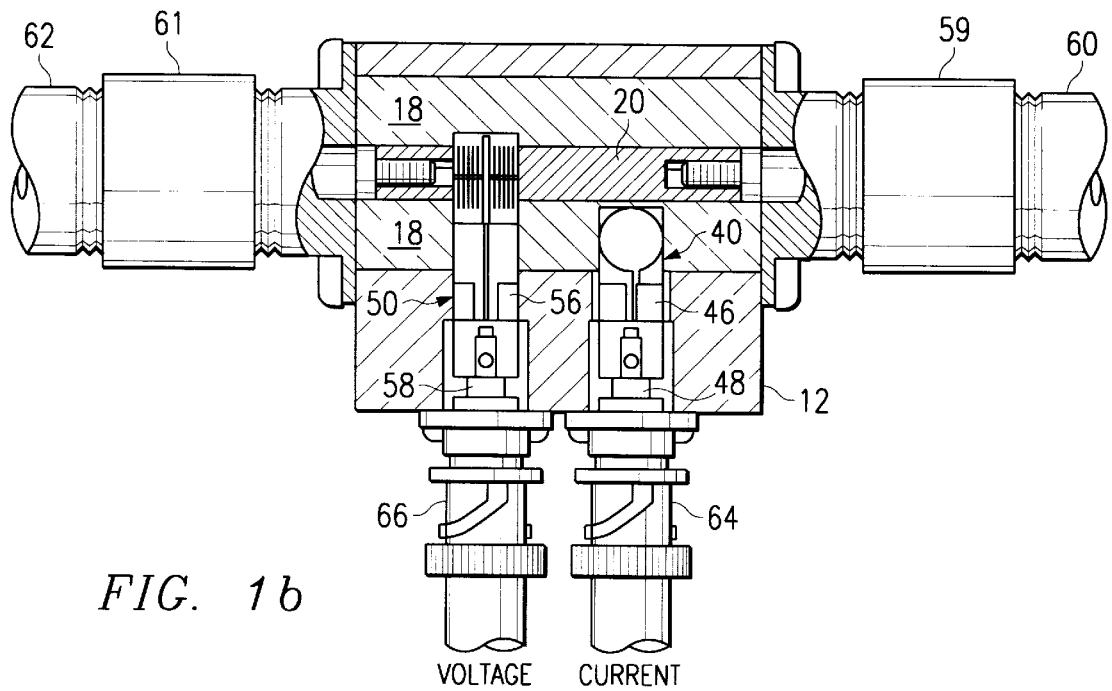
Figure 2:
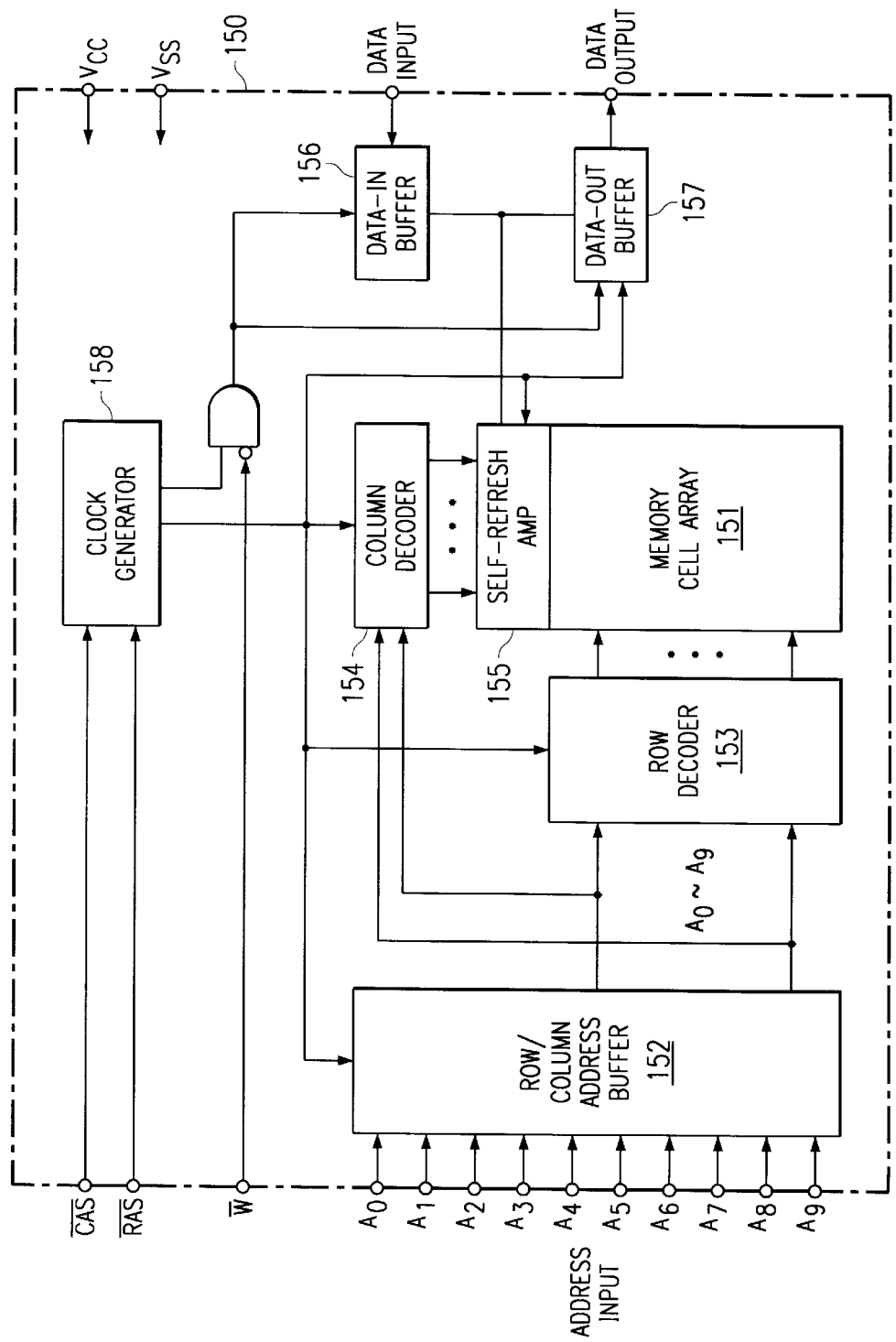
FIG. 2 schematically shows the functional parts of a DRAM.

FIGS. 1a–1b illustrates an ECR reactor setup for use with the preferred embodiments, although other reactors could be used. FIG. 2 schematically shows the functional blocks of a DRAM. An FeRAM is analogous but with drive lines (paralleling the word lines) replacing the common capacitor plate.

First Preferred Embodiments

Figure 3A:
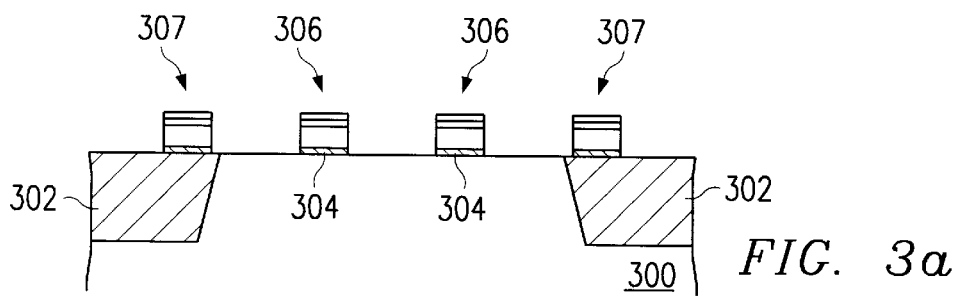
FIGS. 3a–3o show in cross sectional elevation views preferred embodiment fabrication method.
Figure 3B:
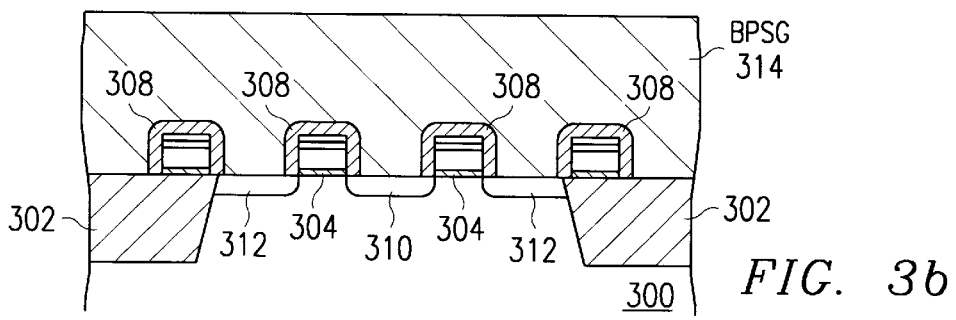
Figure 3C:
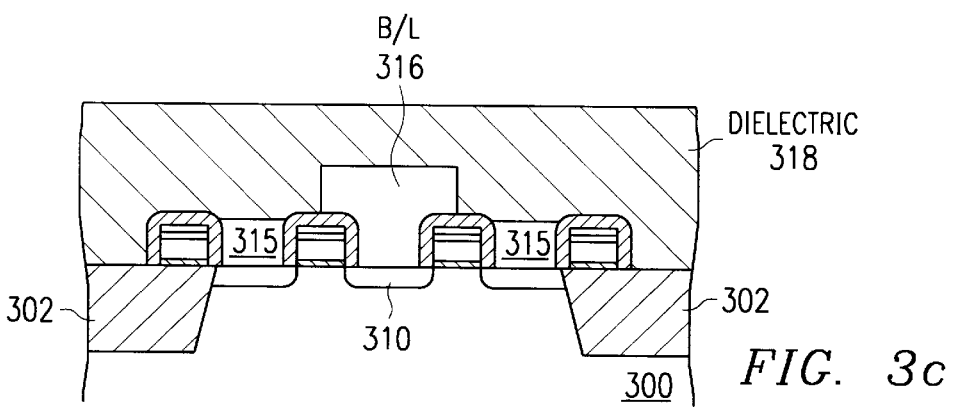
Figure 3D:
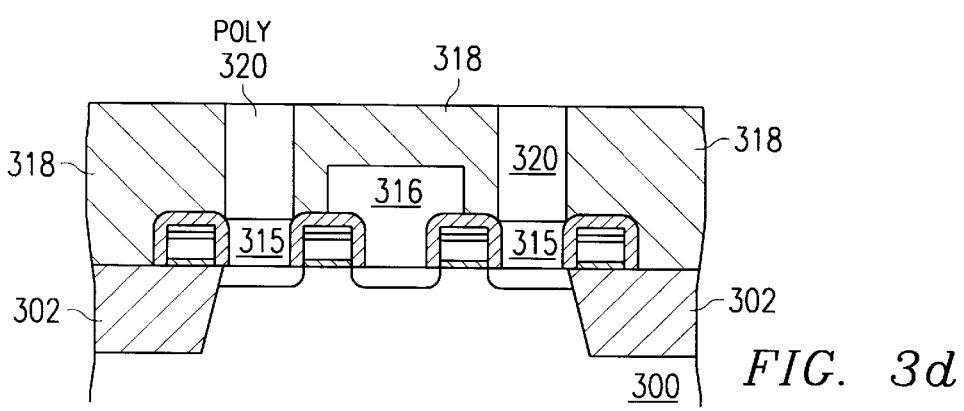
Figure 3E:
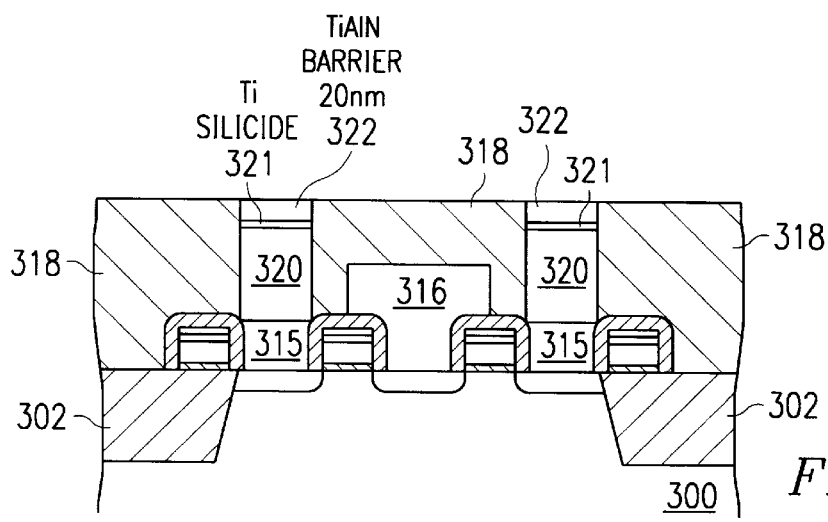
Figure 3F:
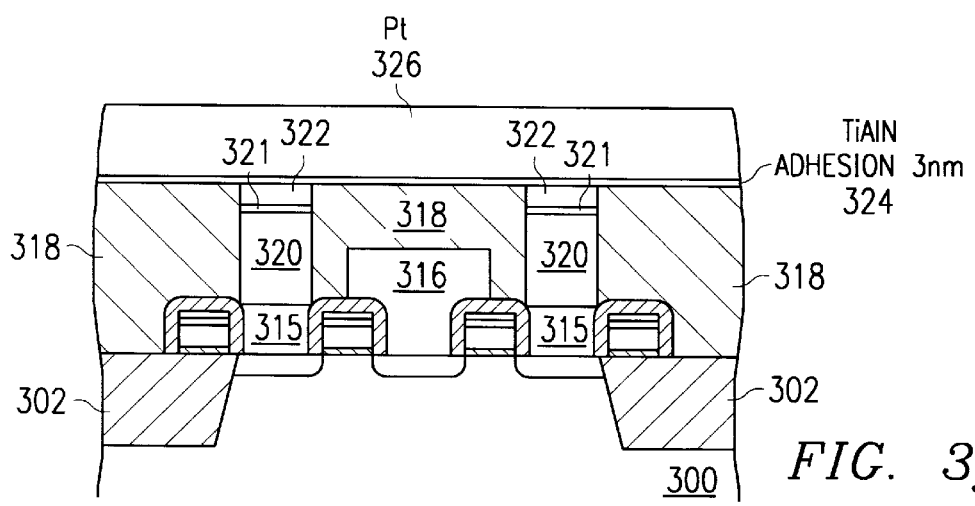
Figure 3G:
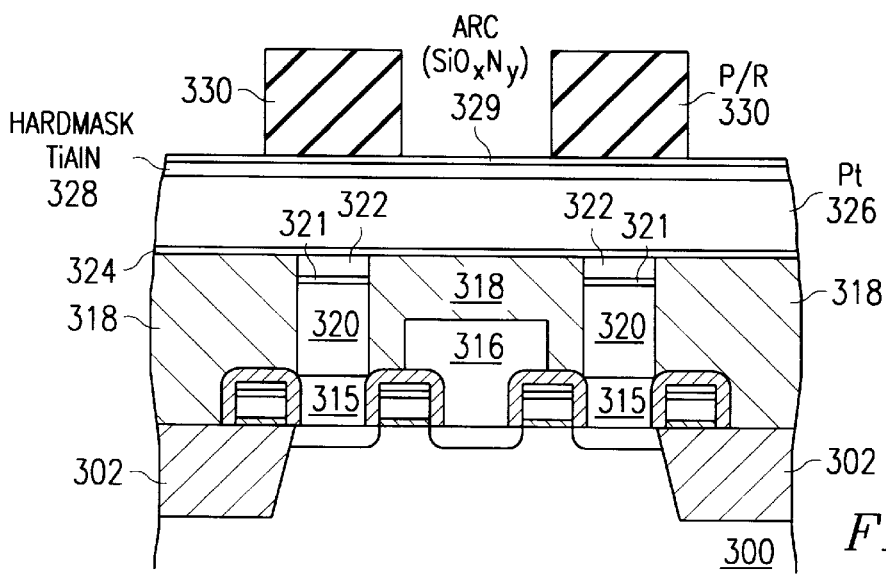
Figure 3H:
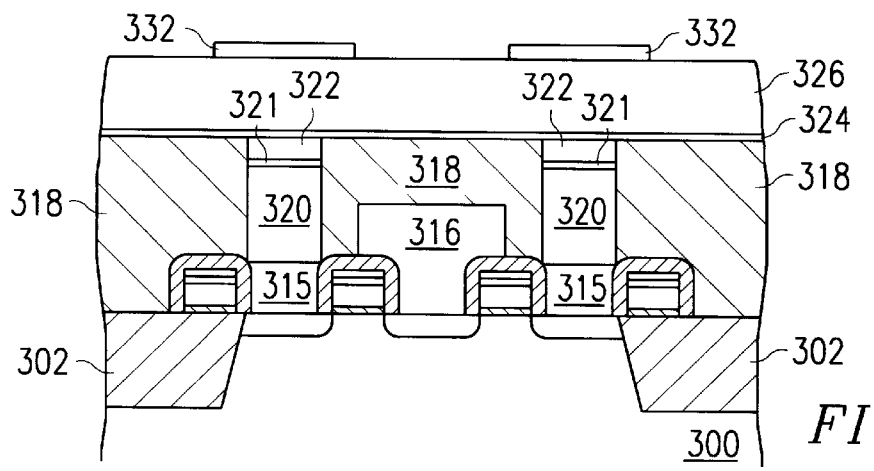
Figure 3I:
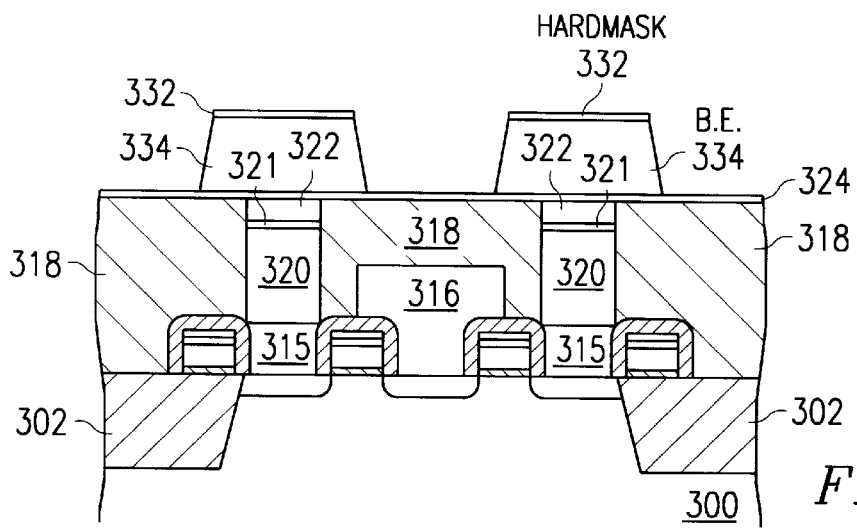
Figure 3J:
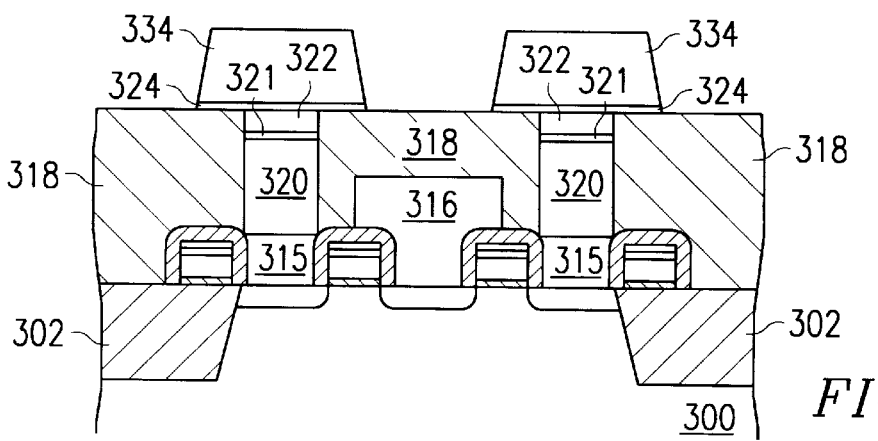
Figure 3K:
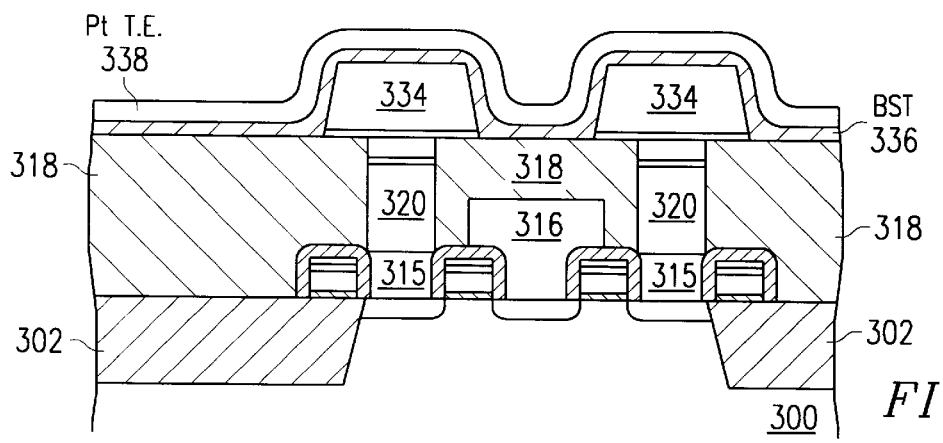
Figure 3L:
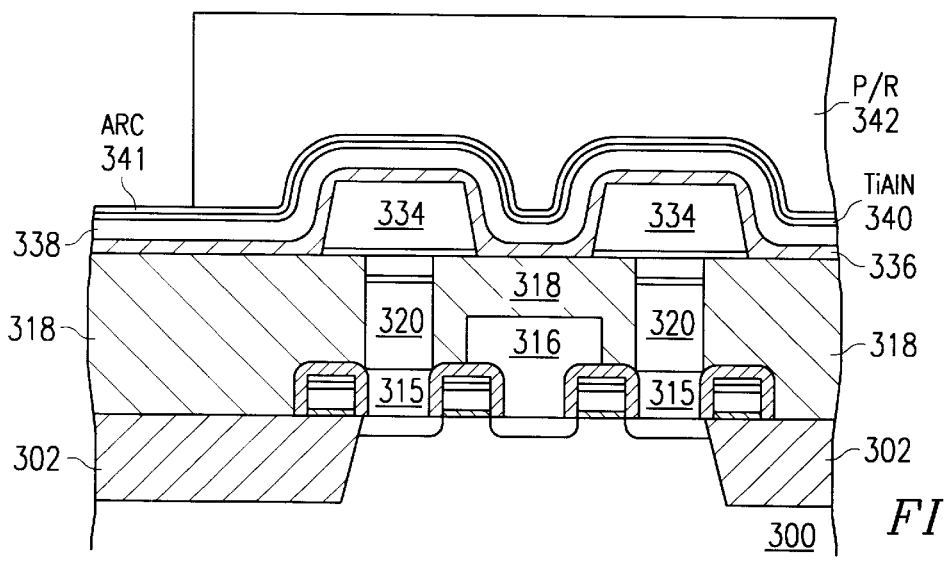
Figure 3M:
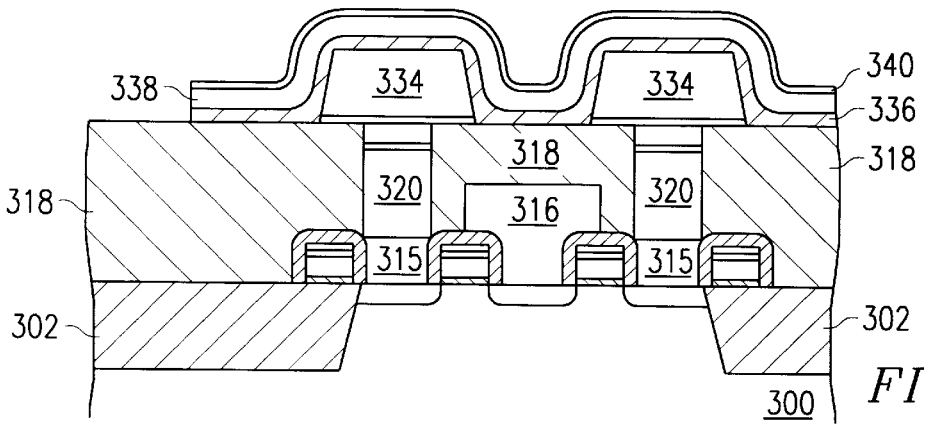
Figure 3N:
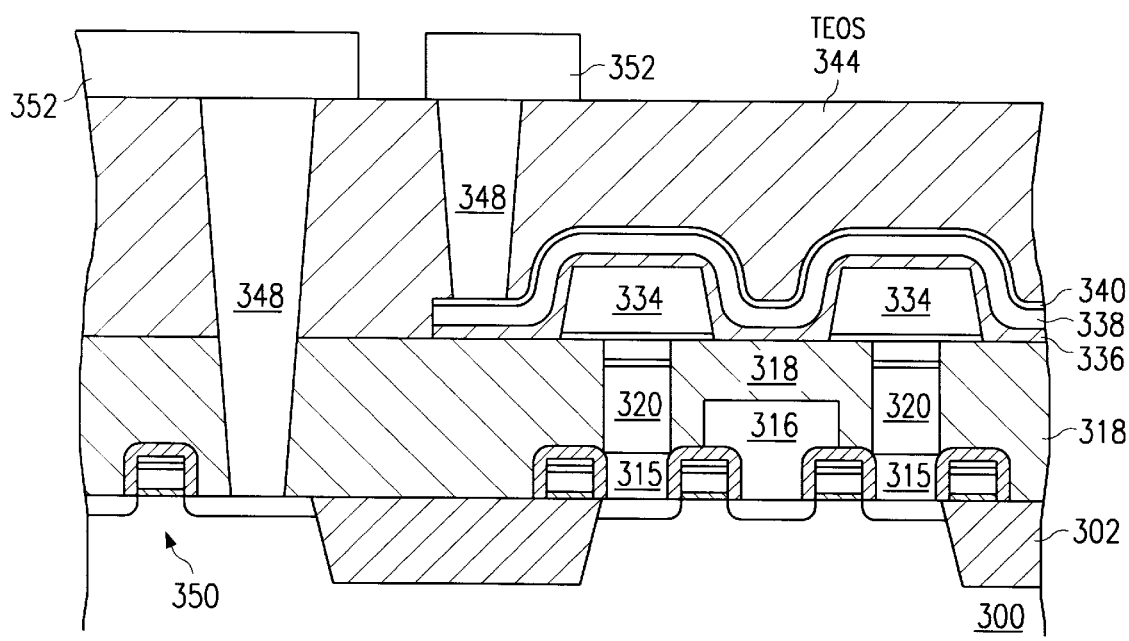
Figure 3O:
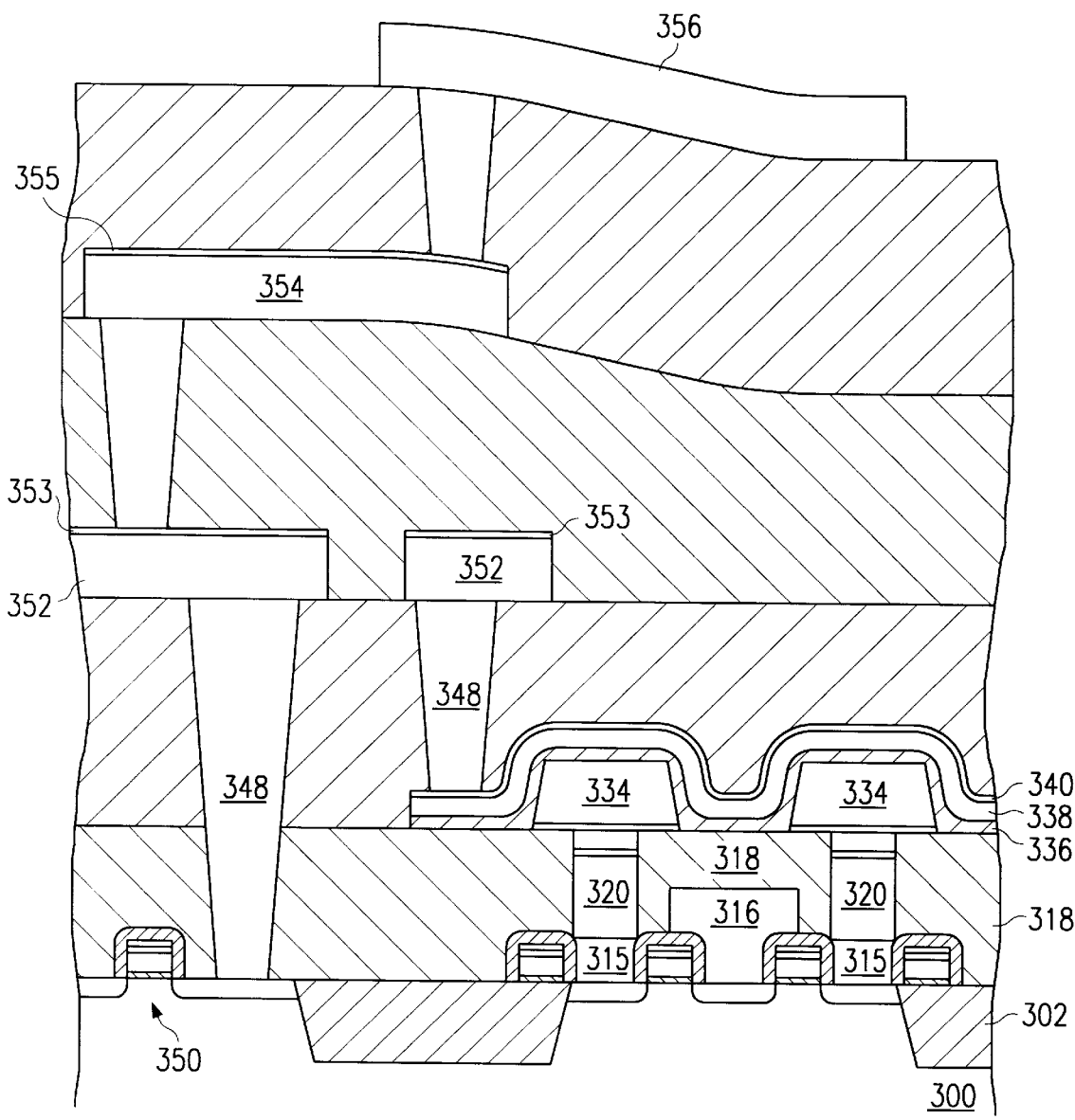

FIGS. 3a–o illustrate in cross sectional elevation views the steps of first preferred embodiment fabrication methods for integrated circuits (e.g., CMOS or BiCMOS) with capacitors or memory cells (e.g., DRAM or FeRAM cells) as follows.

(1) Start with a silicon wafer (or silicon on insulator wafer) with shallow trench isolation and twin wells for CMOS devices. Perform threshold adjustment implants (which may differ for cell transistors and various peripheral transistors), and form gate dielectric. Deposit tungsten silicide coated polysilicon gate material and a silicon dioxide layer, then pattern the layers to form oxide-topped gates plus gate level interconnects. The gate material could also provide a polysilicon emitter for bipolar devices which would also require a prior base implant. See FIG. 3a which shows silicon substrate 300 with shallow trench isolation oxide 302 plus gate dielectric 304, gates 306, and gate level interconnect 307 (i.e., wordlines for a memory array). Gates 306 may be 200–300 nm high and 100–250 nm long (FIG. 3a is a cross section along the gate length, and gates typically have widths much greater than their lengths). An alternative would be formation of polysilicon gates followed by a self-aligned silicidation (after the source/drain and sidewall dielectric formations of the next step) to create a silicide on both the gate top and the source/drains.

(2) Perform lightly doped drain implants, and then form sidewall dielectric 308 on the gates by deposition plus anisotropic etching. Introduce dopants to form sources and drains 310–312. Cover the gate level structure with a planarized dielectric layer 314 (such as BPSG or a stack of conformal and planarized layers including undoped oxide such as a deposition from TEOS); see FIG. 3b.

(3) Photolithographically define and etch holes (contacts, vias) in planarized dielectric 314 down to selected sources 312 for eventual DRAM cell stems. Blanket deposit in-situ-doped polysilicon and etch back to form stems 315 filling the vias.

(4) Photolithographically define and etch holes (contacts, vias) in planarized dielectric 314 down to selected drains 310 for eventual bitline contacts. Blanket deposit in-situ-doped polysilicon and a tungsten silicide cap; and then photolithographically define and etch to form bitlines 316. Deposit oxide to form above-bitline dielectric 318 on the bitlines plus remaining dielectric 314 (which for convenience is no longer separately designated); see FIG. 3c.

(5) Photolithographically define and etch openings (holes, vias) in dielectric 318 down to the tops of stems 315 and fill by blanket deposit in-situ-doped polysilicon and etchback to form stem extensions 320; see FIG. 3d. The etchback may recess stems 320 about 20 to 50 nm below the surface of 318.

(6) Blanket deposit titanium metal to a thickness of about 20 nm and then react in a nitrogen atmosphere with exposed polysilicon stems 320 to form titanium silicide 321 on the tops of stems 320 and in recessed in dielectric 318. Strip the unreacted titanium and titanium nitride which forms over dielectric 318.

(7) Sputter deposit 50 nm thick TiAlN with a composition having a Ti to Al ratio of about 3 to 1 and approximately stoichiometric with respect to nitrogen, although sputtering Ti and Al through a nitrogen plasma typically yields a nitrogen deficient compound. Then apply CMP to planarized plus remove all TiAlN except for TiAlN 322 on silicide 321; TiAlN 322 forms a conductive diffusion barrier and keeps oxygen away polysilicon to prevent silicon dioxide formation by diffusing oxygen or silicon. See FIG. 3e.

Alternatively, instead of the openings being filled with polysilicon 320 in step (5), the openings could be filled with TiN (or other conductive barrier materials) deposited by CVD and planarized. Indeed, even polysilicon 315 could be replaced by TiN. In particular, the blanket deposition of titanium metal would be the same as in the foregoing, and the reaction to form TiSi2 on the opening bottom (whether on polysilicon 315 or on source 312) would also be the same. Then deposit TiN by CVD sufficient to fill the opening (e.g., 150 nm thick). The deposition could be with from a mixture of ammonia plus a precursor such as TiCl4 or TDMAT (Ti[N(CH3)2]4) or TDEAT (Ti[N(C2H5)2]4). TiN formed from TiCl4 has shown 100% step coverage for aspect ratios of the openings as high as 13 to 1 and exhibits a film resistivity of less than 100 uohm-cm. TiN films formed from TDMAT or TDEAT can be either conformal or low resistivity but cannot be both. The advantage of organic precursors is their low growth temperature (300–400 C.). However, the resistivity of organic CVD TiN is higher (200–10000 ohm-cm) than TiCl4 precursor due to the carbon content. The major problem of TiCl4 grown TiN is the Cl residue in the TiN films; this can cause corrosion of Al used for overlying metal. Cl content of less than 1% has been obtained and reasonable reliability has been achieved when the TiN is in contact with Al. Of course, the use of W metallization avoids the Cl problem.

After the TiN deposition, planarize CMP as in the foregoing.

The bulk resistance of the TiN filled opening (presume the opening has a diameter of 0.2 um and a depth of 1 um) will be about 30 ohm when filled with TiN grown by TiCl4 CVD at 400 C. Because the resistivity of TiN formed from TiCl4 decreases as the growth temperature increases, the resistance will drop to 22 ohms if the TiN is grown at 650 C. Growing TiN at higher temperatures also reduces the content of Cl. Given the fact that the contact resistance of a TiN/TiSi2/Si stack of 0.25 um diameter is roughly 250 ohm for n+ Si and 1000 ohm for p+ Si, the resistance contribution from the bulk of TiN in the opening will be small. Indeed, organic grown TiN with resistivities of 2000 uohm-cm can be used to fill the opening with a bulk resistance of roughly 600 ohm; this is comparable to the contact resistance.

(8) Sputter deposit thin (3 nm) adhesion layer 324 of TiAlN; this provides for Pt adhesion to dielectric 318.

(9) Sputter deposit 200–400 nm thick layer 326 of Pt; see FIG. 3f. This thickness determines the height of the resulting pillar capacitor and thus the capacitance, so circuit requirements determine the height.

(10) Sputter deposit 50 nm thick hardmask TiAlN (roughly $Ti_{0.75}Al_{0.25}N$) layer 328, a thin hardmask implies less sidewall for redeposition of Pt during Pt etching. An alternative is a hardmask of other Ti to Al ratios or TiN or TiSiN or TiAlSiN.

(11) Treat TiAlN hardmask layer 328 with oxygen to increase subsequent etch selectivity and limit pitting of the eventual Pt electrode. In effect, some Al and Ti will oxidize to form $AlO_x$ (e.g., Al2O3) and $TiO_x$ (e.g., TiO2) at and near the surface of the hardmask, and this surface will better withstand the low pressure (effectively sputtering) chlorine etch of Pt 326. The preferred treatment for TiAlN hardmask 332 is a 2 minute exposure to a plasma of N2 and N2O (flows of 2200 and 1800 sccm, respectively) at a pressure of roughly 20 Torr and a power of 500 W at 450 C. for an 8 inch wafer. Note that the TiAlN likely is nitrogen deficient, and the N2O and N2 also help maintain the nitrogen content. This treatment reduces the etch rate of the hardmask during the Pt etch by a factor of roughly 5.

Alternative oxygen treatments of TiAlN hardmask layer 328 include an anneal in O2 with a pressure of 10 Torr at a temperature of 700 C. for 2 minutes. This high temperature anneal is somewhat more effective than the N2O plasma and further reduces the hardmask etch rate. Lower temperature O2 anneals likewise reduce the etch rate but not as significantly. In particular, a 2 minute O2 anneal at 600 C. is less effective than the N2O and N2 plasma treatment, and a 450 C. anneal even less.

Further, an oxygen plasma such as used for photoresist ash can also provide an oxygen treatment for the TiAlN hardmask and reduce the etch rate, but this is less effective than the N2O and N2 plasma treatment.

For the alternative hardmask of TiN, the same oxygen treatments (N2O and O2 plasmas or O2 anneal) can be used, and lower temperatures anneals are effective. In fact, a 450 C. anneal in O2 for a TiN hardmask reduces the hardmask etch rate by about the same factor as a 600–700 C. anneal for the TiAlN hardmask. Thus increasing the Al content requires increasing the oxidation conditions because the TiAlN is more oxidation resistant than TiN.

(12) Deposit by PECVD with silane and N2O layer 329 of SiON to act as an antireflective coating (ARC). This can use the same N2O plasma chamber as used in the oxygen treatment of the TiAlN in the preceding step. The thickness and composition of layer 329 are adjusted to effectively eliminate reflections at the photoresist-ARC interface by use of destructive wave interference. For example, use a composition of roughly $Si_{0.46}O_{0.45}N_{0.09}$ with a thickness of 25 nm for 248 nm wavelength exposure of photoresist.

An alternative is to use organic ARC which just absorbs the exposure radiation. An ARC thickness of 60 nm typically suffices.

(13) Spin on photoresist. Expose and develop the photoresist to define the locations of the bottom electrodes; see FIG. 3g with resulting patterned photoresist 330. The bottom electrodes may have a rectangular footprint of 1f by 2f–3f, with f the feature size (100–250 nm), depending upon capacitance requirements.

(14) Use the patterned photoresist 330 as a mask to etch ARC 329 with a fluorine based plasma (e.g., CF4+CHF3) and then to etch TiAlN 328 with a chlorine-based plasma (e.g., Cl2). Alternatively, an argon-chlorine plasma (Ar/Cl2 ratio about 0.2 to 1.5) with a small amount (5–20%) of CHF3 can be used to etch both SiON ARC 329 and TiAlN 328. Next, strip photoresist 330 with an oxygen plasma, and optionally also strip the exposed ARC with a fluorine based plasma, although the ARC can remain and act as additional hardmask. (In the case of organic ARC, then a strip is preferred to limit production of residue during the Pt etch.) This leaves TiAlN hardmask 332 on Pt layer 326; see FIG. 3h. The TiAlN etch could be in an ECR single wafer plasma etcher with a gas of Cl2 at a pressure of 10 mTorr and a low plasma bias (<200 V); this etches TiAlN about 10 faster than it etches Pt.

An alternative applies the oxygen treatment to the TiAlN hardmask of foregoing step (11) after this patterning of the TiAlN.

(15) Use hardmask 332 with a plasma etch to etch Pt 326 and thereby form bottom electrode 334; see FIG. 3i. The etch uses a low pressure (0.5–1 mTorr), high-density plasma of Cl2+O2+N2 in a single wafer ECR plasma etcher with a plasma bias of 300 V. This provides mostly a sputtering of Pt, PtCl$_x$ compounds have very low vapor pressure. Raising the wafer temperature to 400 C. will help PtCl$_x$ volatility. The O2 helps keep an oxidized surface on TiAlN 332 to deter erosion by the etch, and the N2 helps maintain the nitrogen content of TiAlN 332 and thereby also slows erosion. Further, the nitrogen apparently deters sidewall redeposition of Pt, and this results in steeper sidewall slopes. The nitrogen may form a partial monolayer on the Pt sidewall surface that effectively decreases the sticking coefficient of sputtered Pt atoms, or the nitrogen may combine with oxygen to form such a partial monolayer.

Figure 5A:
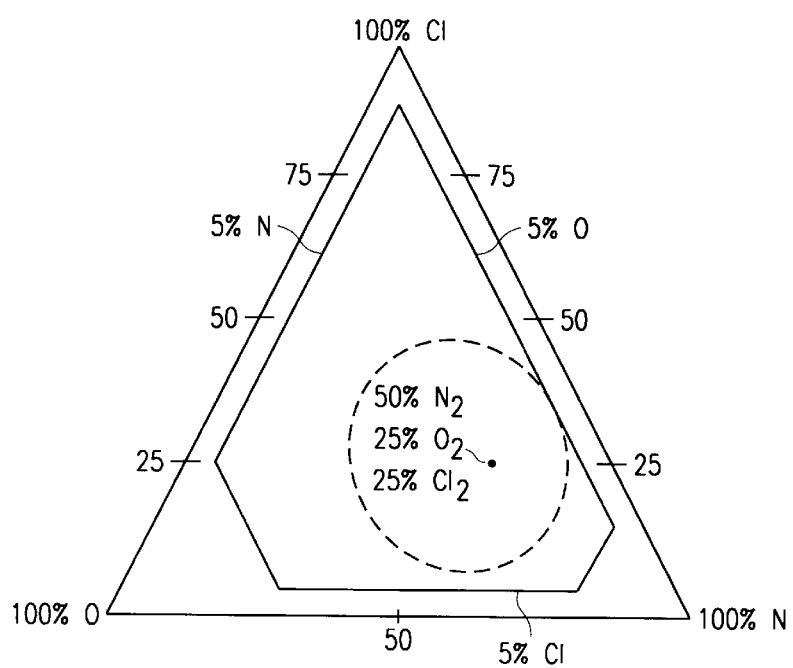
FIGS. 5a–5b show etch parameters.

A plasma excited from the mixture of Cl2+O2+N2 in roughly equal amounts theoretically yields a majority of Cl$^+$ ions with lesser portions of O$^+$ and other ions such as N$^+$, Cl2$^+$ and O2$^+$. Thus the sputter etching should primarily be Cl$^+$ sputtering of the Pt. Consequently, a plasma from a gas mixture of Ar+O2+N2 will have roughly similar sputtering because the Ar$^+$ ions generated have about the same mass as Cl$^+$ ions; however, the use of Ar does not lead to analogs of PtCl$_x$ type complexes, and so an Ar-alone plasma is less effective at removal of sputtered Pt. A plasma excited from an Ar+O2+N2 mixture will still have the O2 and N2 effects of deterring TiAlN hardmask erosion plus effectively reducing sticking coefficient of redepositing Pt. A mixture of Ar+Cl2+O2+N2 will provide intermediate results. These etches yield a sidewall slope of 70–80 degrees. Gas mixtures with other oxygen and nitrogen sources, such as N2O, could be used along with the sputtering species Cl. At least about 5% O2 (or other O source) appears sufficient to maintain the hardmask and over roughly 70% O2 slows the Pt etching rate too much. Similarly, at least about 5% N2 (or other N source) appears sufficient to maintain the hardmask and over roughly 80% N2 slows the Pt etching. A mixture of 25% O2, 50% N2, and 25% Cl2+Ar works well. More generally, FIG. 5a illustrates preferred embodiment mixtures within the dashed lines.

Figure 5B:
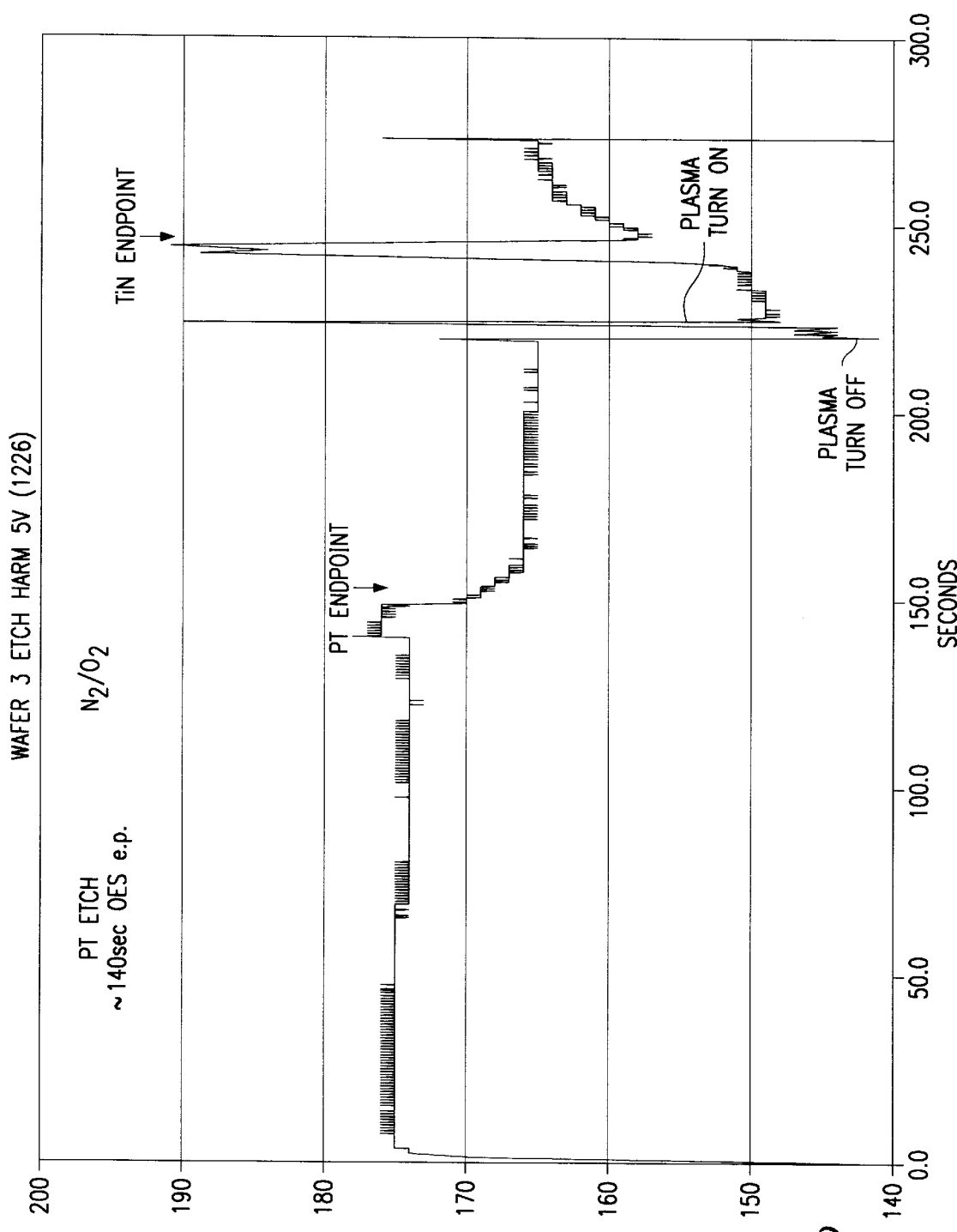

Detect the endpoint of the Pt etch (i.e., when the Pt is just clearing the underlying TiAlN 324) by monitoring the fifth and seventh harmonics of the RF bias power. The ECR plasma etcher applies 1500 W at 2.45 GHz to excite the plasma plus applies 900 W at 13.56 MHz to the wafer chuck to generate a plasma bias of about 300 V to provide sufficient energy to the ions bombarding the Pt. FIG. 1a shows a current and voltage detector in the coaxial power line, and FIG. 1b shows such a detector. FIG. 5b shows the current of the seventh harmonic of 13.56 MHz (i.e., 94.92 MHz) as a function of time during the Pt etch; the clearing of the Pt results in a large drop in the seventh harmonic of the current. Other current and voltage harmonics also vary during the etching, but the fifth and seventh harmonics appear especially sensitive for this Pt etch.

The use of an RF power harmonic endpoint detector has an advantage over optical endpoint detection in that an optical port in the etch chamber wall will become covered with redeposited Pt and cutoff the optical signal, whereas the power harmonic detector has no such limitation.

The main etch may take up to 2 minutes, and a 1 minute overetch suffices. The etch etches Pt about 10 times faster than it etches TiAlN. The Pt etch has converted Pt layer 326 into bottom electrodes 334; see FIG. 3i.

(16) Strip TiAlN 332 and exposed TiAlN 324 with a chlorine based plasma with low plasma bias as described in foregoing step (13); see FIG. 3j

(17) Conformally deposit BST dielectric layer 336 by CVD to a thickness of 50 nm; then deposit top electrode Pt layer 338 of a thickness 100 nm by sputtering; see FIG. 3k. If a FeRAM with ferroelectric capacitors is desired, then a ferroelectric such as SBT would be deposited rather than BST.

(18) Deposit top barrier TiAlN 340 by sputtering to a thickness of 20 nm, deposit SiON ARC 341 to the appropriate thickness and composition for reflection elimination by PECVD from silane and N2O (or spin on organic ARC), and then spin on photoresist. Expose and develop photoresist 342 to define a memory cell array; see FIG. 3l. Alternatively, if a ferroelectric had been deposited rather than BST, then photoresist could define the locations of the drive lines for a FeRAM cell array.

(19) Use patterned photoresist 342 as a mask to etch exposed ARC 341, underlying TiAlN 340, Pt 338, and BST 336, stopping on dielectric 318 or on partially etched BST 336. Then strip photoresist 342 and underlying ARC 341; see FIG. 3m.

(20) Deposit inter metal level dielectric (ILD) 344 and planarize by CMP.

(21) Photolithographically define holes (contacts, vias) and fill with metal 348.such as by a blanket deposition followed by planarization or etch back.

(22) Blanket deposit a first metal level, and pattern it to form first level interconnects 352. See FIG. 3n.

(23) Metal interconnects 352 may have top cladding 353, such as TiN cladding for aluminum metal. Further metal levels follow the same via formation and fill, planarized inter metal level dielectric, via fill, metal deposition and patterning to form interconnects 354 (with cladding 355) and 356; see FIG. 3o.

Silicon Oxide/Nitride Hardmask

The TiAlN hardmask 332 could be replaced with a hardmask of silicon dioxide or silicon nitride or silicon oxynitride; although the selectivity of the Pt etch will decrease. In this case an organic ARC layer would be used. A silicon dioxide or silicon nitride hardmask does not need the pre etch oxidation treatment.

However, with a high temperature (e.g., 250–350 C.) version of the Pt etch of foregoing step (15), the volatility of PtCl$_x$ species increases to improve sidewall slope, but the selectivity of the etch decreases. Thus for a high temperature etch add a thick silicon oxide or silicon nitride or silicon oxynitride hardmask on top of the TiAlN 328 to form a bi-layer hardmask. Again, use organic ARC. In particular, after depositing a 20 nm thick TiAlN layer 328 deposit a 500–600 nm thick silicon oxide or silicon nitride or silicon oxynitride layer, spin on 60 nm thick organic ARC, and then spin on photoresist. Note that the top TiAlN provides adhesion between Pt and silicon dioxide/silicon nitride and also provides an etch stop during the strip of the silicon oxide or silicon nitride or silicon oxynitride after the Pt etch.

Expose and develop the photoresist to define the capacitor locations, etch the organic ARC (oxygen plasma), etch the silicon oxide/nitride/oxynitride layer (fluorine-based plasma), etch the TiAlN (chlorine-based plasma), and strip the photoresist and organic ARC (oxygen plasma).

Etch the Pt using the previously described Ar/Cl2 plasma with less than 5% O2 plus N2 to increase etch rate because O2 and N2 will not significantly slow the erosion of the silicon dioxide/nitride/oxynitride hardmask. Etch for a time that should remove about 80% of the Pt (or until the Pt etch endpoint is first detected by RF current harmonics). Then overetch with extra O2 added to the gas mixture for increased selectivity to bottom TiAlN 324. For example, increase the O2 to at least 20% of the gas mixture. Also, add N2 (e.g., 10%) to help maintain the TiAlN 324 which will be the etch stop.

After the Pt etch, strip the silicon dioxide/nitride/ oxynitride hardmask; the bottom TiAlN protects the underlying ILD and the top TiAlN is an etch stop on the Pt. Then strip the top and exposed bottom TiAlN.

Softmask Preferred Embodiment

An alternative Pt etch eliminates the hardmask and uses only a photoresist mask during a Cl2 RIE etch. In general, photoresist-only mask etching of Pt with Cl2 leads to redeposition on the photoresist sidewall, forming a "fence" of residues which is difficult to remove. The preferred embodiment uses a two-step etch process. During the first step, performed with a Cl2 flow of 50 sccm at a pressure of 0.5 mTorr and a MW power of 1500 watts and RF power of 900 watts, etch the Pt (plus any adhesion layer) through to the underlying dielectric (e.g., oxide). Then increase the pressure to about 10 mTorr and continue for a 20% overetch. The higher pressure leads to an enhanced photoresist removal rate, which, in turn, serves to remove the Pt residue fence. This approach increases the Pt sidewall slope compared to the one-step approaches which remove the fence, although not as steep as the hardmask etching previously described. Experimentally, this two-step (low pressure, then high pressure overetch) etch yields slopes about 60 degrees with no fence using standard photoresist processing.

This two-step preferred embodiment Pt etch could be used for lower density devices because the area enhancement is not as great as with steeper sidewalls, but the two-step process with only photoresist masking simplifies the Pt etch processing. This two-step etch could also be used for ferroelectric capacitor stack etches as described in subsequent preferred embodiments.

Light Irradiation Etch Enhancement

The $PtCl_x$ reaction products during the Cl2+O2+N2 etch of Pt have low volatility and do not readily desorb from the Pt surface. However, illuminating the Pt surface with radiation of wavelengths centered about 265 nm (UV) at a power density on the order of at least 1.5 watts/cm2 apparently will induce photochemical reactions to desorb the reaction products and permit etching at low temperatures (e.g., 50 C.). This should achieve the same results as the 250–350 C. etching.

For such radiation assisted etching, change the design of the plasma etcher of FIG. 1a to laterally offset the ECR power input and put a transparent window in the chamber top directly over the wafer. Thus a radiation source (e.g., KrF excimer laser) can be mounted on the outside of the chamber and illuminate the wafer during etching.

Platinum Oxide Electrodes

Anneals in hydrogen-containing atmospheres during CMOS processing (such as a final aluminum sinter plus transistor improvement anneal in forming gas at 400 C.) can lead to degradation of BST, PZT, SBT, and other such materials. Pt electrodes have insufficient hydrogen diffusion barrier properties, but other materials such as PtOx, Ir, IrO2, Ru, RuO2, . . . do provide hydrogen diffusion barriers. However, the resistivity of PtOx is at least an order of magnitude greater than that of Pt. Thus a preferred embodiment Pt electrode for use with the foregoing preferred embodiments has a thin layer of PtOx at the interface of the BST, PZT, or SBT and the Pt.

In particular, after etching the lower Pt electrode 334 and removing hardmask 332 (as illustrated in FIG. 3j), oxidize the surface of Pt electrode 334 by exposure to activated oxygen, such as from a plasma in an ECR reactor. Indeed, apply 1000 W of MW power and low power RF bias (to create a plasma bias in the range of 0–100 volts) with a pressure of 10 mTorr and an oxygen flow of 100 sccm for 5 minutes. This grows roughly 4–4.5 nm of PtOx when the wafer temperature is 64 C., but grows only about 3.7 nm of PtOx at 400 C. and almost none at 650 C. The PtOx appears to be amorphous and primarily PtO2 with some PtO and thermally metastable. The oxidation appears to be self-limiting, and the 64 C. oxidations yields a rougher surface than the 400 C. oxidations.

Immediately following the Pt surface oxidation, continue with deposition of BST dielectric 336 and top Pt electrode 338 as illustrated in FIG. 3k. Note that an analogous thin PtOx layer at the interface of the BST and the top Pt electrode can be formed by first sputtering a very thin (e.g., 2 nm) Pt layer and then completely oxidizing it with an oxygen plasma as just used to oxidize the surface of the bottom Pt electrode. Deposition of such a thin Pt layer requires low temperatures, and the Pt may not completely cover the surface. After the oxidation of the thin Pt layer, sputter deposit more Pt to complete the top Pt electrode.

Various oxygen-containing plasmas can be used such as O2, O3, N2O, and combinations of these along with optional inert gasses. Similarly various types of reactors could be used to create the active oxygen for the Pt oxidation, including remote plasmas and photochemical assistance.

The hydrogen barrier properties of PtOx can also protect the BST (or PZT or SBT) with the PtOx buried in the Pt electrode away from the interface with the BST. This imbedding the PtOx in the Pt electrode makes fabrication of the top Pt electrode simpler: deposit half of the top Pt, surface oxidize it as with the bottom electrode, and then deposit the other half of the top Pt. Of course, other multilayers of Pt and PtOx can be fabricated by in the same manner for use as electrodes. Also, the PtOx can act as an oxygen source during a high temperature crystallization anneal of the BST.

Capacitor Under Bitline Preferred Embodiments

Figure 4A:
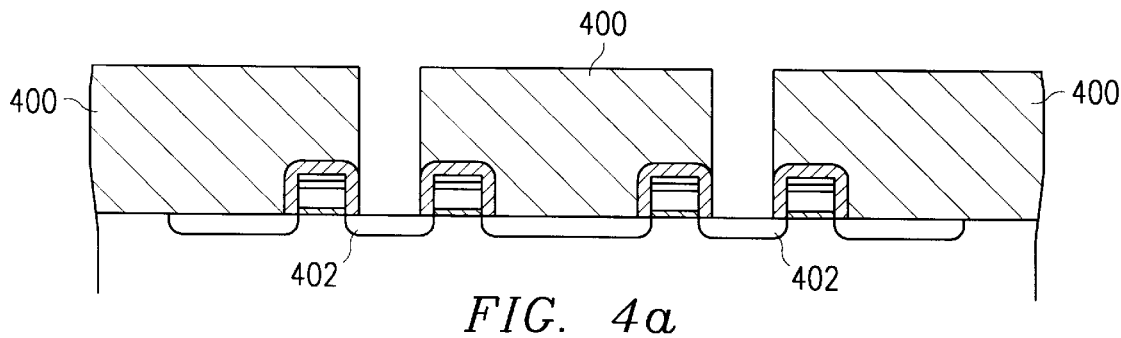
FIGS. 4a–4h illustrate an alternative structure.
Figure 4B:
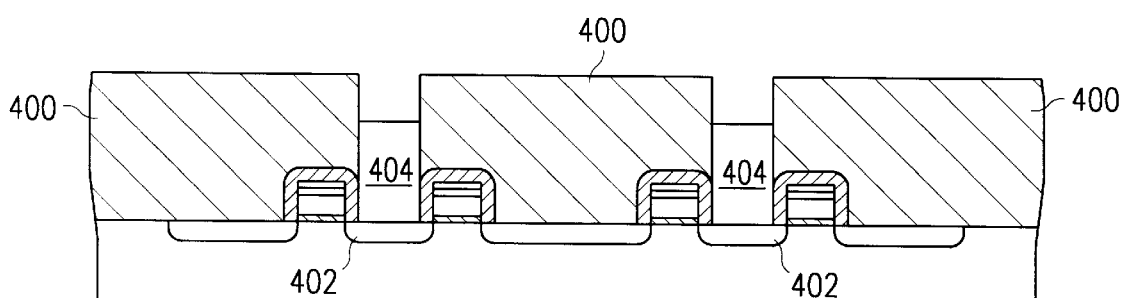

FIGS. 4a–4h illustrate a capacitor-under-bitline version of the foregoing capacitor-over-bitline structure. In particular, FIG. 4a shows vias formed, and FIG. 4b illustrates the vias partially filled with doped polysilicon 404. Again, the partial filling may be by a blanket deposition with etch back. This is analogous to FIG. 3d showing polysilicon 320 filling vias.

Figure 4C:
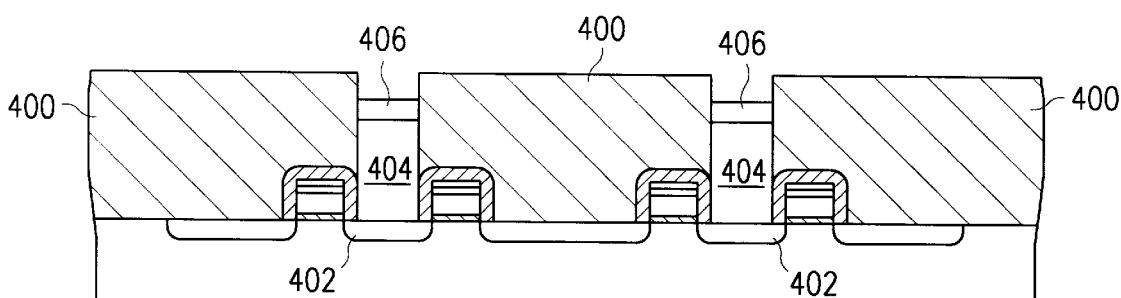
Figure 4D:
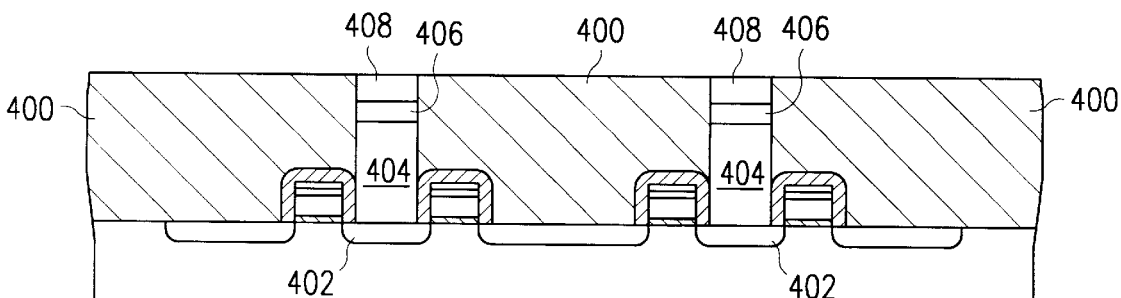

FIG. 4c shows silicide 406 formed by blanket metal deposition followed by silicidation reaction and unreacted metal strip. FIG. 4d illustrates diffusion barrier 408 analogous to diffusion barrier 322 of FIG. 3e; the diffusion barrier may be made of TiAlN and formed by blanket deposition and planarization such as by CMP.

Figure 4E:
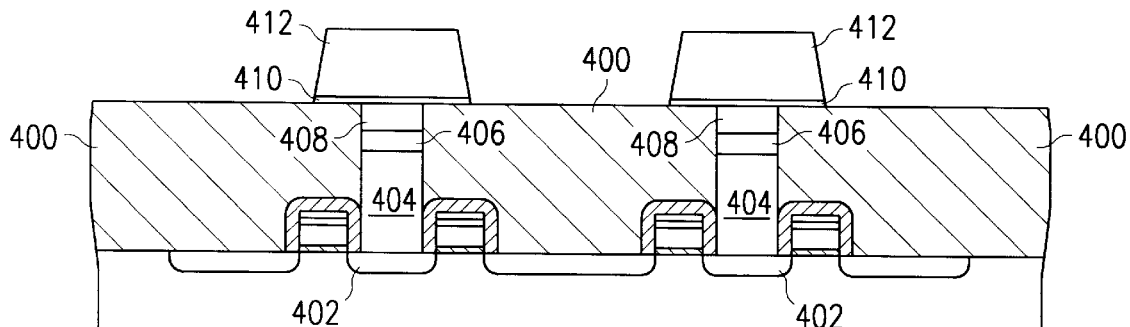
Figure 4F:
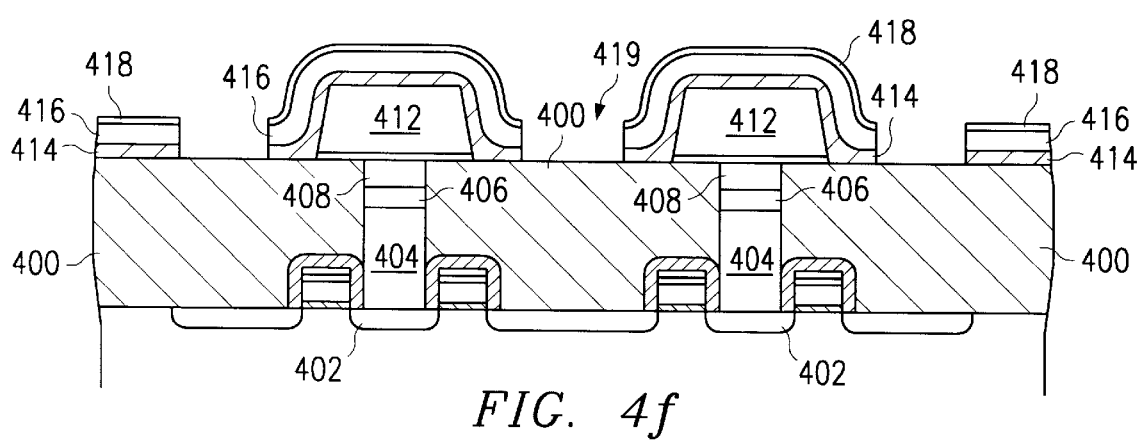

FIG. 4e illustrates platinum bottom electrodes 412 with adhesion TiAlN 410 after etching; this is analogous to FIG. 3j. FIG. 4f shows the BST 414, platinum top electrode 416, and top diffusion barrier 418 after patterning. The BST and top electrode may be common for all capacitors, and opening 419 is just at the location of the eventual bitline contact; opening 419 separates the top electrode from the eventual bitline contact 432.

Figure 4G:
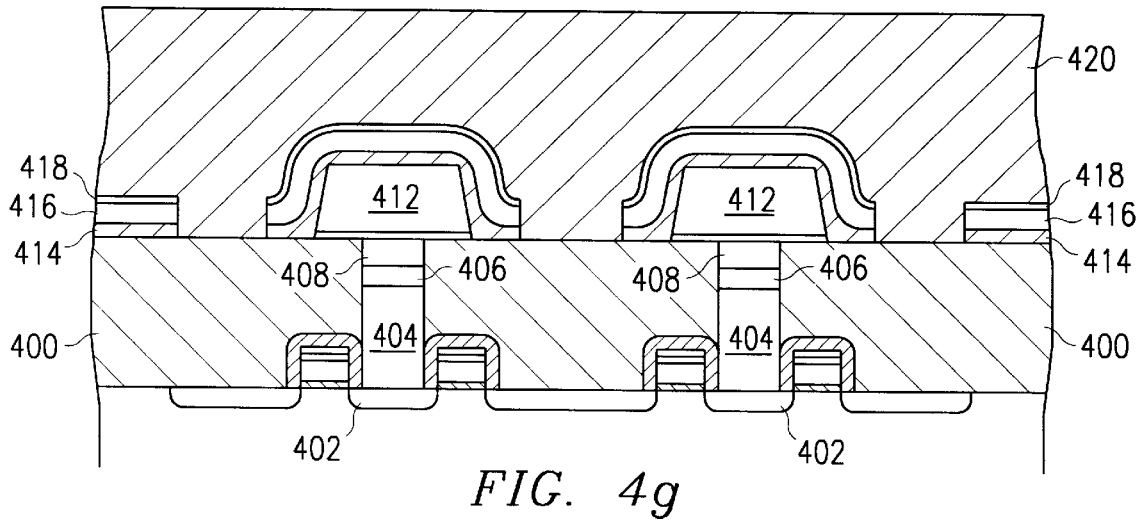
Figure 4H:
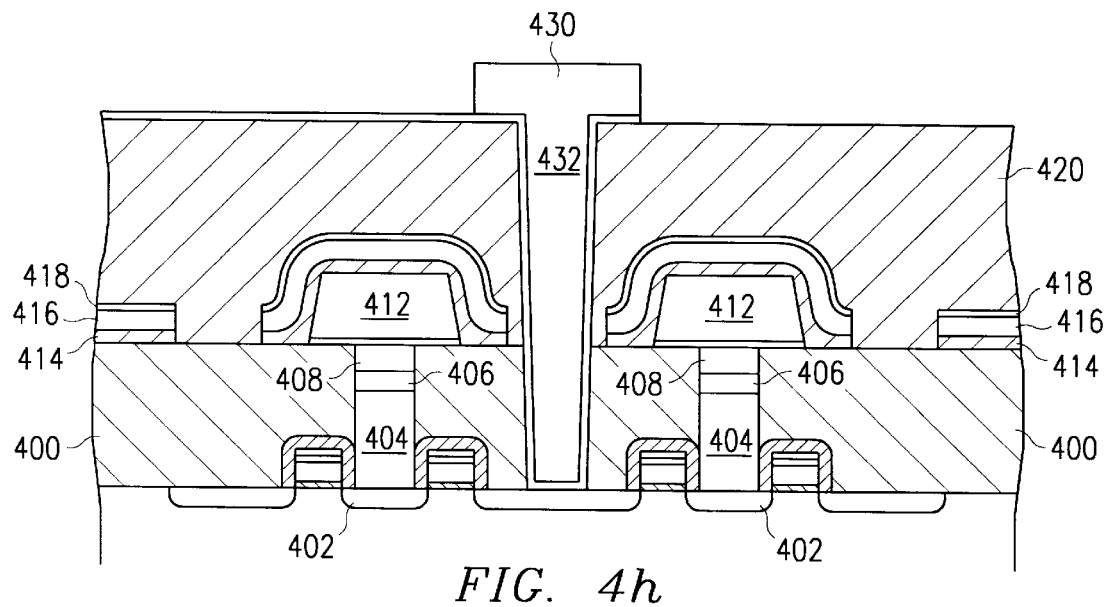

FIG. 4g shows planarized dielectric 420. Lastly, FIG. 4h shows bitline 430 making contact 432 to the common drain of the transistors after contact etch and fill. The portion of bitline contact 432 through dielectric 400 could have been formed and filled (with polysilicon) simultaneously with the capacitor stems in FIGS. 4a–4d. In this case the bitline contact through dielectric 420 would be a shallower and simpler to etch rather than through both dielectrics 400 and 420 at the same time.

Alternative Materials Etch The foregoing etches of the Pt bottom electrodes may be adapted to etch materials such as Ir, Ru, . . . , and their oxides (as described in the following sections) and used for DRAMs and FeRAMs but also may be adapted to etch materials such as FeNi, FeNiCo, NiCr, . . . which are used in magnetic storage devices. That is, the N2 added to the plasma gasses and/or TiAlN or variant hardmasks used should improve sidewall slopes for essentially sputtering or ion milling etches with Ar and/or Cl.

Second Preferred Embodiments

Figure 6A:
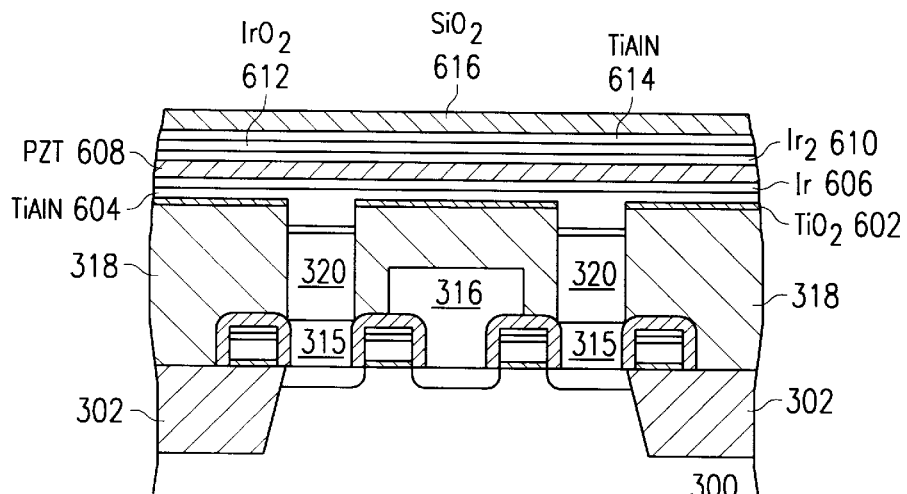
FIGS. 6a–6f are cross sectional elevation views of another preferred embodiment fabrication method.

FIGS. 6a–o illustrate in cross sectional elevation views the steps of second preferred embodiment fabrication methods for integrated circuits (e.g., CMOS or BiCMOS) with memory cells (e.g., FeRAM cells) as follows.

(1) Follow steps (1)–(7) of the foregoing first preferred embodiments to have a structure as illustrated in FIG. 3e. Optionally, dielectric 318 includes a 30 nm thick top layer 602 to act as a diffusion barrier. Layer 602 could be TiO2, Al2O3, and so forth.

(2) Form a stack of layers as follows:

Sputter deposit 50 nm thick layer 604 of $Ti_{0.6}Al_{0.4}N$ (bottom conducting diffusion barrier);

Sputter deposit 100 nm thick layer 606 of Ir (bottom electrode, Pt is not as good as Ir for PZT);

MOCVD 100 nm thick layer 608 of PZT (ferroelectric);

Sputter deposit 50 nm thick layer 610 of Ir (top electrode), additionally, a 10 nm thick layer 612 of IrO2 may be included;

Sputter deposit 50 nm thick layer 614 of $Ti_{0.6}Al_{0.4}N$ (top conducting diffusion barrier); alternatively, the TiAlN could be 200 nm thick and used also as the hardmask;

CVD 200 nm thick layer 616 of silicon dioxide (hardmask). See FIG. 6a which shows TiO2 diffusion barrier 602.

An alternative to MOCVD PZT is MOD PZT: spin on precursors and polymerize. Then cure and anneal at 600 C. in a N2 atmosphere. IrO2 in an electrode acts as an oxygen source to avoid oxygen depletion of PZT 608, and the anneal improves the PZT characteristics by crystallizing the essentially amorphous PZT.

(3) Spin on photoresist, then expose and develop the photoresist to define the FeRAM capacitor locations. The capacitors may have a 100 nm by 250 nm rectangular footprint.

Figure 6B:
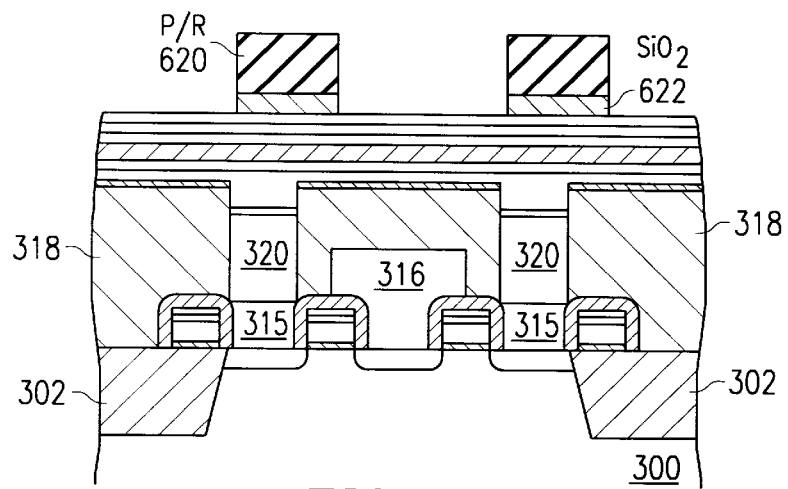

(4) Use the patterned photoresist 620 as a mask to etch oxide hardmask layer 616 to form oxide hardmasks 622; a CF4+CHF3 based plasma oxide etch works, and overetching into TiAlN 614 is not a problem. FIG. 6b shows the photoresist masks offset from perfect alignment over the capacitor stems 315, 320. Then strip the photoresist.

Figure 6C:
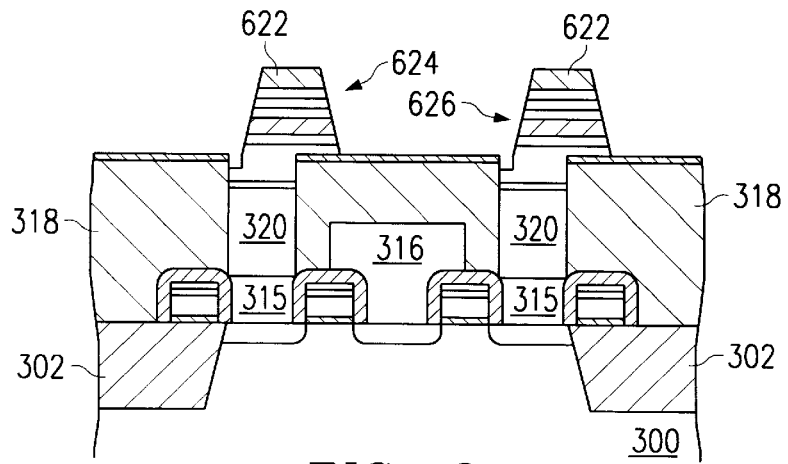

(5) Use oxide hardmasks 622 to etch the TiAlN/Ir/PZT/-Ir/TiAlN stack in an ECR single wafer plasma etcher with a multistep etch as follows. First, use a Cl2 plasma etch at 10 mTorr pressure and 50 sccm flow and low RF bias power (300 W) but high MW power (1500 W) to etch the top TiAlN 614 with the decrease of optical emission at the 414 nm line for endpoint detection; include a 10 second overetch. Next, drop the pressure to 0.5 mTorr with flows of 25 sccm Cl2 plus 25 sccm O2 and increase the RF bias power to 900 W to etch Ir 610 and add a 15 second overetch. Detect the endpoint by the decrease of optical emission of Ir at 378 and 351 nm and the increase optical emission of PZT at 367 nm. Then maintain the pressure and power but shift to flows of 10 sccm Cl2, 20 sccm O2, 25 sccm CF4, and 50 sccm Ar to etch PZT 608 together with a 15 second overetch. Detect the endpoint by optical emission decrease at 367 nm and the increase at 378 and 351 nm. Next, repeat the foregoing Ir etch, and then repeat the foregoing TiAlN etch to strip the exposed TiAlN 604 and stop on the diffusion barrier 602 (if barrier 602 is TiO2 or Al2O3, then this etch may have low selectivity). The etch of the bottom TiAlN will also trench into the TiAlN in the recess over the stems, but the etch is short enough due to the thinness of the bottom TiAlN that only a tolerable amount of the recess TiAlN will be removed. See FIG. 6c showing the resulting ferroelectric capacitors 624 and 626.

The stack etch can be summarized by the following table detailing the steps and conditions:

| Step | Cl2 Sccm | O2 sccm | N2 Sccm | CF4 sccm | Ar sccm | Press. (mTorr) | ECR (W) | RF (W) | Time | Comment |
|---|---|---|---|---|---|---|---|---|---|---|
| 1. | 50 | 0 | 0 | 0 | 0 | 10 | 1500 | 300 | OES | Etch exposed TiAlN OES 414 nm |
| 2. |  | 92 | 8 | 0 | 0 | 10 | 1500 | 0 | 3 min | Ash PR |
| 3. | 25 | 25 | 0 | 0 | 0 | 0.5 | 1500 | 900 | OES | Ir TE etch w/O$_2$: 351, 378 nm decrease; PZT 367 nm increases |
| 4. | 10 | 20 | 0 | 25 | 50 | 0.5 | 1500 | 900 | OES | PZT etch w/O$_2$: 367 nm decrease |
| 5. | 50 | 0 | 0 | 0 | 0 | 0.5 | 1500 | 900 | OES | TiAlN remove: 414 nm peak (fast); don't etch through Ir BE 351, 378. |

The foregoing steps are all carried out at relatively low temperatures (e.g., less than 200 C.) with backside wafer cooling (such as by helium flow). The table uses the abbreviations OES for optical emission spectroscopy, PR for photoresist, TE for top electrode, and BE for bottom electrode.

(6) Deposit a 30 nm thick conformal layer of insulating diffusion barrier TiO2 630 by sputter deposit Ti and heat in an O2 atmosphere; alternatively, use PECVD with precursors TiCl4 and O2. Then deposit a 20 nm thick conformal layer 632 of silicon nitride by PECVD with SiCl4 and N2. TiO2 630 is a diffusion barrier for Pb and thus TiAlN 604, 614 plus sidewall TiO2 630 encapsulate PZT 608 which limits Pb out-diffusion. See FIG. 6c. Similarly, silicon nitride 632 and TiAlN 604, 614 are hydrogen diffusion barriers and limit later in-diffusion of hydrogen which can degrade PZT 608. The use of SiCl4 and N2 for silicon nitride deposition rather than the usual SiH4 plus NH3 avoids hydrogen generation during the deposition. Similarly, the use of TiCl4 plus O2 rather than MOCVD with O2 plus metalorganics such as TiEt4, TiMe4, TDMAT also avoids the introduction of hydrogen.

Alternative Pb diffusion barrier materials for the capacitor sidewalls include Al2O3, Ta2O5, ZrO2, and so forth, plus materials such as AlN, SiC; and these materials can be analogously deposited either as metals and oxidized or by CVD. The diffusion barriers (for Pb and for H) could be a single material or multilayers.

Figure 6D:
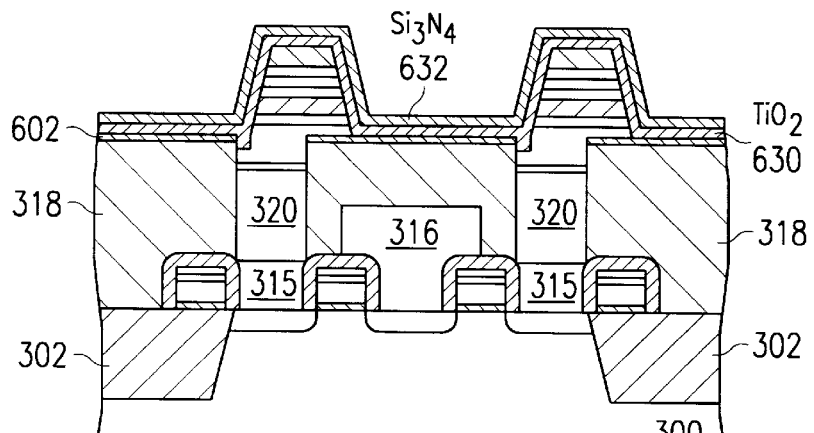
Figure 6E:
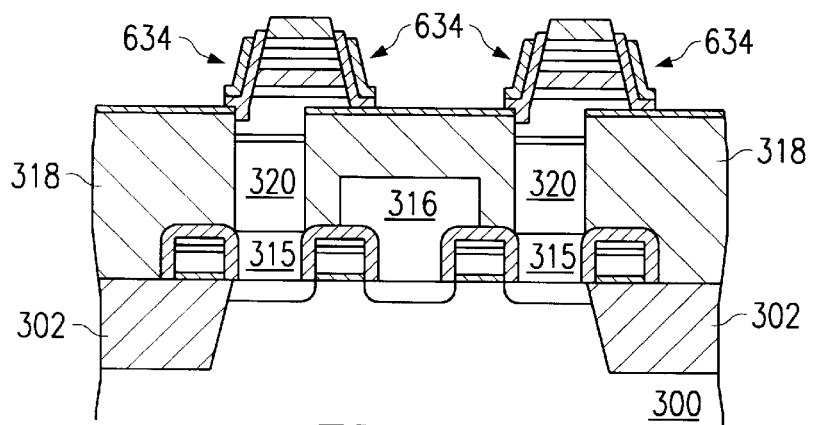

(7) Anisotropically etch the deposited silicon nitride 632 and TiO2 insulating diffusion barrier 630 to leave only a sidewall two-layer dielectric 634; see FIG. 6e. This is a two-step etch, the first step is plasma CF4+CHF3 to etch silicon nitride, and the second is plasma of Cl2 to etch TiO2. This etch will stop on a silicon nitride barrier 602 but will strip the exposed portion of a TiO2 barrier 602. An alternative TiO2 etch is an ECR plasma with high RF bias power and a 0.5 mTorr pressure from 10 sccm Cl2, 25 sccm CF4, plus 50 sccm Ar.

Figure 7A:
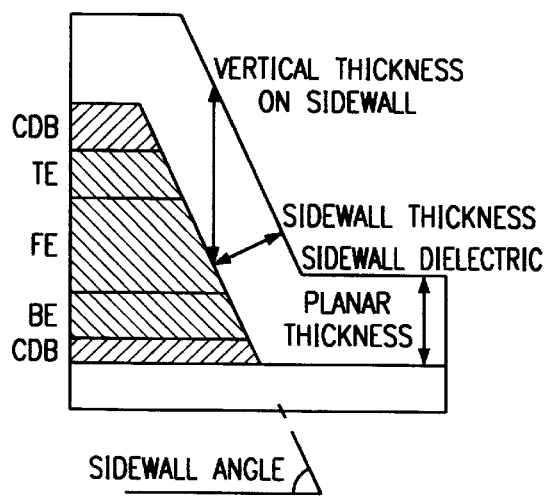
FIGS. 7a–7d illustrate sidewall geometry and endpoint detection.

The thickness of the resulting sidewall two layer dielectric 634 depends upon the thickness of the conformal depositions and the slope angle of the capacitor sidewalls. In particular, the deposition of the diffusion barrier material will yield a thickness of the diffusion barrier on the sidewalls which is not as thick as on the planar surfaces. The conformality of the deposition is the ratio of the thickness on the sidewalls to the thickness on the planar surfaces. The conformality will in general decrease as the aspect ratio (capacitor height to distance between capacitors) of the gap between capacitors increases. The conformality will also improve as the sidewall slope becomes less steep. Notice that the vertical thickness on the sidewall can be substantially larger than the thickness on the planar surfaces; see FIG. 7a.

Figure 7B:
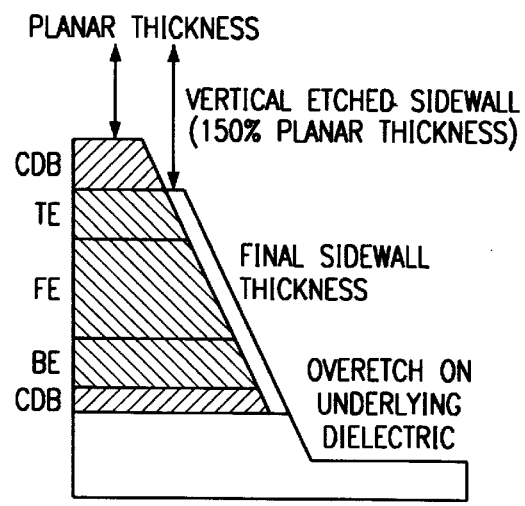

FIG. 7b shows the situation after anisotropic etching. In practice a significant overetch is needed, and FIG. 7b includes the results of a 150% overetch. The overetch will always recess the sidewall diffusion barrier from the top of the capacitor. In FIG. 7b the recess allows the sidewall diffusion barrier to only cover the top electrode and not the top conductive diffusion barrier. Too much overetch will recess the sidewall diffusion barrier such that it no longer covers the ferroelectric. It is possible to increase the thickness of the top electrode and the top conducting diffusion barrier such to make sure that the sidewall diffusion barrier still covers the ferroelectric even with a large overetch. Similarly, a thick hardmask will insure ferroelectric coverage; see FIG. 6e.

Another impact of the overetch on the capacitor structure is that both the top of the capacitor and the underlying substrate will be etched for the amount of the overetch time. The etching rate of the exposed materials is therefore important. FIG. 7b shows no etching of the top conducting diffusion barrier but the same etching rate of the interlevel dielectric beneath the capacitor as the sidewall diffusion barrier material.

Figure 7C:
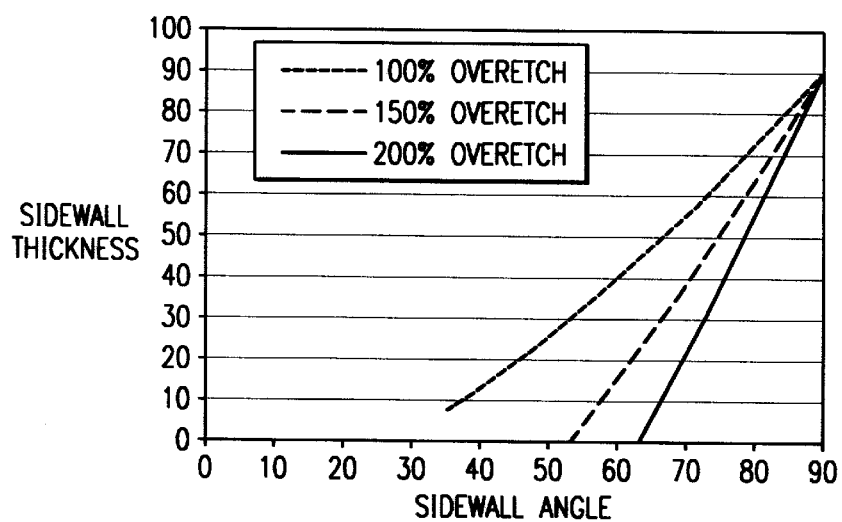
Figure 7D:
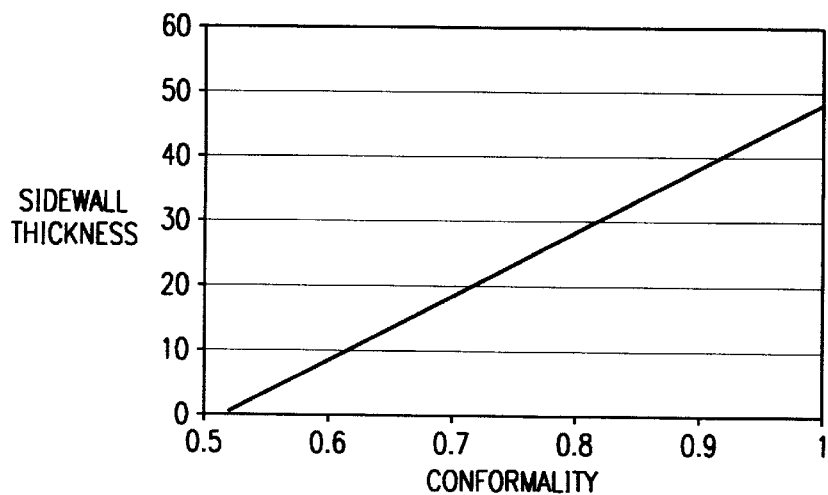

FIGS. 7c–7d illustrate the interaction between the sidewall slope, amount of overetch, and conformality on the final sidewall diffusion barrier thickness. FIG. 7c shows the relatively large fraction of sidewall material (50%) can be achieved even with 150% overetch if the slope is relatively steep (~75 degrees). If 25% remaining sidewall material is acceptable, then even 64 degree slopes are acceptable with 150% overetch; but is such a case a two layer sidewall (e.g., silicon nitride on TiO2) should have a much thicker outer layer for it to survive as part of the final sidewall material. FIG. 7c also shows that increasing the overetch from 150% to 200% does not drastically reduce the amount of sidewall material. These calculations are for 90% conformality, and this number is consistent with sidewall thickness at 90 degree sidewall angle.

FIG. 7d shows the impact of conformality. Smaller conformality results in less material as expected but the sidewall slope is not extremely sensitive to this number.

(8) Deposit interlevel dielectric 640 such as silicon dioxide by PECVD and planarize, such as by CMP, to leave roughly 500 nm of oxide over the capacitors, including the hardmask 622.

(9) Photolithographically define and etch holes (contacts, vias) in planarized dielectric 640 through hardmasks 622 down to conducting diffusion barriers TiAlN 614. This is an oxide plasma etch using CF4+CHF3.

(10) Conformally deposit 20 nm thick TiN barrier metal, and then deposit 300 thick Al:Cu. This fills the vias of the preceding step. Alternatively, fill the vias separately from the metal deposition to form drive lines and interconnects.

(11) Pattern the metal to form drive lines for the ferroelectric capacitors and interconnects away from the memory cell array. See FIG. 6f

(12) Form planarized IMD/ILD over drive lines and interconnects.

(13) Form further metal interconnect levels by repetition of the via etch, via fill, metal deposition and patterning. Alternatively, dual damascene processing could be used for the drive lines and interconnects.

Insulating Diffusion Barrier Variations

Figure 6F:
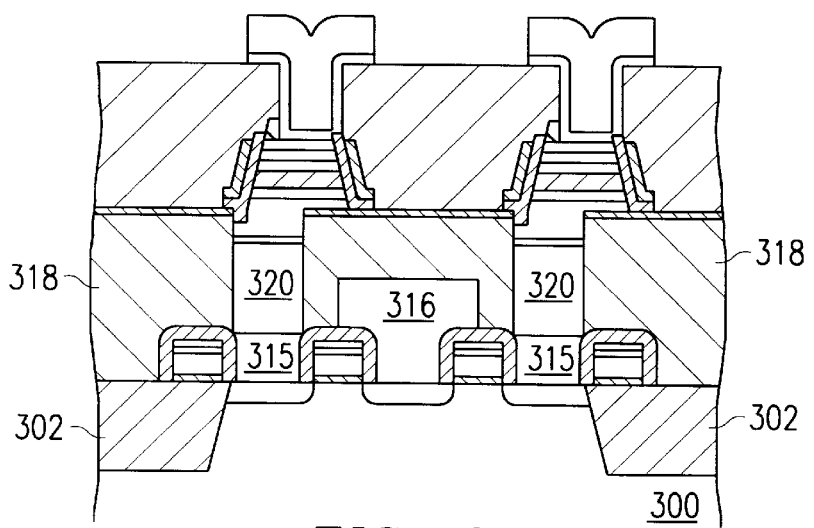

The sidewall insulating diffusion barriers of FIGS. 6e–6f (and FIG. 7b) could be simplified and the entire barrier layer of FIG. 6d (and FIG. 7a) left in place. In this case the via etch analogous to foregoing step (9) (and FIG. 6f) would be through both the ILD and the diffusion barrier. In particular, FIG. 14 illustrates alternative one-step and two-step etches with photoresist (PR) mask through ILD (SiO2) and insulating diffusion barrier TiO2.

Indeed, perform either an extensive over-etch of the $SiO_2$, using standard chemistry and a standard RIE reactor (the lower alternative in the righthand portion of FIG. 14), or perform a multi-step etch sequence, in which the $TiO_2$ is etched separately following initial etch of the $SiO_2$ layer (the upper alternative in the righthand portion of FIG. 14). Various chemistries can be used for the $TiO_2$ etch, depending on the etch rate and selectivity that is needed.

This sequence of steps can also be reversed for the case of diffusion barrier etchback prior to ILD deposition.

The chemistries for the $SiO_2$ etch should contain a mixture of H- and F-containing gas, and an inert gas (e.g., He, Ne, Ar, Kr, Xe) can be used. The preferred chemistry for a particular reactor (AMAT P5000 RIE system) consisted of 15 sccm $CF_4$, 30 sccm $CF_3H$ and 100 sccm Ar flows to give a total process pressure of 100 mTorr.

Of course, other gases (e.g., $CH_2F_2$, $CH_3F$, $CH_4$, $C_2F_6$, $C_3F_6$, $C_3F_8$, $XeF_2$, $NF_3$, $SF_6$), can be the sources of the F and/or H species. An etch chemistry which substitutes or adds compounds containing Cl, Br or I species will have similar properties.

For the $TiO_2$, a combination of Cl- and F-containing species is used. Preferred embodiments include a $Cl_2/CF_4/Ar$ mixture of the ratio 10/25/50 sccm or 25/25/5 sccm or a $Cl_2/O_2/CF_4/Ar$ mixture of the ratio 10/20/25/50 sccm. As mentioned above, other gases can be substituted or added, such as other inert gases, or other sources of Cl, O or F (e.g., $XeF_2$, $NF_3$, $SF_6$). An etch chemistry which or adds or substitutes Br-containing species in place of the Cl-containing species will have similar properties. This etch can be also used for PZT of different compositions and doping, as well as other sidewall insulating diffusion barrier ($Al_2O_3$, AlN, etc.) or ferroelectric materials (e.g., SBT, BST).

FIG. 15 illustrates the quadratic model for $TiO_2$ etch selectivity to photoresist. Non-linear dependences on $Cl_2$ fraction and the halogen fraction, expressed in terms of the $Cl_2$ and $CF_4$ flow ($Cl_2+CF_4$), are seen. While the photoresist etch rate is not so sensitive to the change in conditions, the $TiO_2$ rate is greatest with high (although not 100%) halogen fraction. Predictions of the etch rates and selectivity for various $Ar/Cl_2/CF_4$ mixtures shown in FIG. 15 indicate that the most useful area of process space appears to be the lower two-thirds of the triangular mixture plot.

The total process pressure is an important variable which provides additional control of etch rate and material selectivity. For example, high pressure operation (10 mTorr) increases chemical etching at the expense of physical sputtering, compared with low pressure conditions (0.5 mTorr). Likewise, the plasma power(s) and plasma substrate bias also control variables which can be used to adjust the process. These variables will depend on the reactor type that is employed. For the ECR-enhanced RIE reactor used for our demonstrations, we used pressures in the range 0.1 to 10 mTorr, microwave power from 300 to 1500 W and RF power from 0 to 900 W. The plasma bias under these conditions ranged from 0 (at 0 W applied RF power) to ~–325 V (at 900 W RF power).

The wafer temperature is another variable which will affect etch parameters. These etches described here used a He backside cooling in order to keep a low wafer temperature. Although the maximum temperature was not measured, photoresist on top of the wafer was still easily removed after etching. Increasing the wafer temperature will increase the component of chemical etching at the expense of sputter etching. It should then be possible to reduce the ion energies of the etch gas which will reduce the physical etch component and hence potentially improve the etch selectivities as well.

Of course, other types of etch reactors can be used to accomplish this etch, with suitable flow ratio and additive optimization, to improve selectivity and etch profile. Some examples are those with a single RF supply (such as inductively-coupled plasma (ICP) or parallel plate reactors) or dual RF supplies, or other enhanced plasma generation sources. While the system employed here uses 13.56 MHz rf and 2.45 GHz microwave generators, other plasma frequencies can be used with similar chemistries to those described here.

As mentioned above, other gases can be substituted or added, such as other inert gases, or other sources of Cl, or F (see Table below). An etch chemistry which or adds or substitutes Br-containing species in place of the Cl-containing species will have similar properties.

Remote sensing of etch endpoint can be accomplished in numerous ways, including optical emission spectroscopy (OES), mass spectrometry, or applied RF power sensing. In the case of OES, material-specific signatures have been determined for $SiO_2$ (483.5 nm) and $TiO_2$ etching (322, 335, 364, 375, 415 and 430 nm).

Additional wet-etch or recovery anneal steps may also be used to remove etch damage layers, as appropriate.

Electrode Variations

The Ir electrodes (either bottom or top or both) of the foregoing capacitors could be replaced with Ir plus IrO2 layers in order to have an oxygen source to deter oxygen depletion during crystallization anneals. A preferred embodiment method of making alternating layers of Ir and IrO2 first deposits Ir (e.g., sputter deposit 50 nm), then oxidize the surface of the Ir with an oxygen plasma to grow about 3 nm of IrO2. Another layer of Ir can be deposited by further sputter deposition, and another oxidation can be performed. In this manner any number of alternating Ir and IrO2 layers can be made. Also, a thin Ir layer can be entirely oxidized, so a stack can begin and end with either Ir or IrO2.

Experiments yielded the following results with an O2 flow of 100 sccm at a pressure of 10 mTorr and a MW power of 1000 watts and a DC bias of 0 to 100 volts for a 5 minutes plasma oxidation of Ir at substrate temperatures of 64 to 500 C.:

| Temperature (C) | Bias (V) | Oxide thickness (nm) |
| --- | --- | --- |
| 64 | 0 | 0 |
| 64 | 50 | 2.8-3.4 |
| 64 | 100 | 4.4-5.3 |
| 250 | 0 | 2.4-4.2 |
| 250 | 50 | 3.1-4.2 |
| 500 | 0 | 10-15 |

Plasma oxidation appears to give smoother IrO2 surfaces than furnace oxidation and at a much lower temperature.

Various permutations of the Ir and IrO2 layers are possible electrodes; in particular, the following: Ir/PZT/IrO2, IrO2/PZT/Ir, Ir/PZT/IrO2/Ir, Ir/PZT/Ir/IrO2/Ir, Ir/IrO2/PZT/IrO2/Ir, Ir/IrO2/PZT/Ir/IrO2/Ir, Ir/IrO2/Ir/PZT/IrO2/Ir, Ir/IrO2/Ir/PZT/Ir/IrO2/Ir.

More generally, various materials could be used for the top and bottom electrodes such as noble metals (Ir, Pt, Ru, Rh, Pd, Pt, Ag, Au) or conducting oxides such as IrO2, RuO2, PdO, RhO2, SrRuO3, LaSrCoO3, YBa2Cu3O7, etc. or multiple layers or alloys of these materials.

MOCVD Ferroelectric Deposition

For the small geometry features of high density memories, the ferroelectric material needs to be smooth with a uniform grain structure. Small grain size is important in obtaining smooth surfaces. Smooth surfaces are needed in order to have a uniform electric field through the ferroelectric film as well as maintaining a low leakage current through the film. Thickness non-uniformities also degrade reliability because they create regions with large electric fields.

Figure 11A:
FIGS. 11a–11f show nucleation of ferroelectric.
Figure 11B:
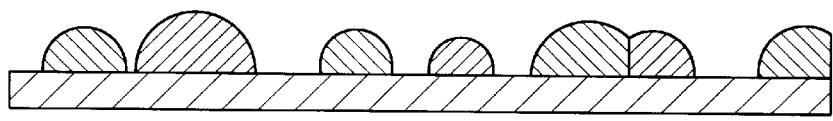
Figure 11C:
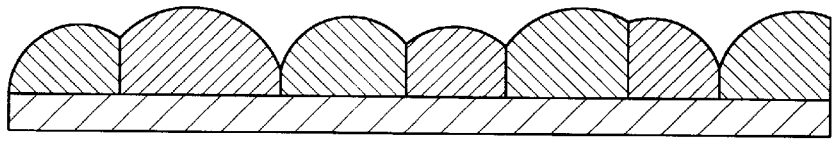
Figure 11D:
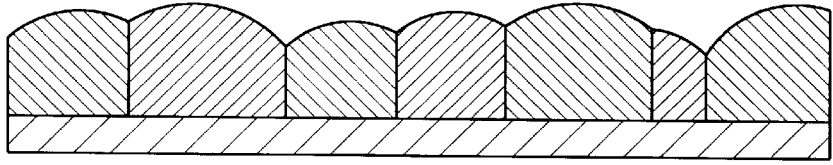
Figure 11E:
Figure 11F:
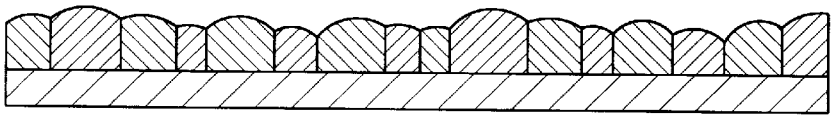

Standard thermal MOCVD PZT has fairly large grain size (roughly 100 nm diameter) and rough surfaces (peak-to-valley variation of roughly 40 nm). To produce fine-grain films by MOCVD, the preferred embodiments enhance nucleation density with approaches which include: (1) Use plasma pre-treatment of the bottom electrode prior to thermal MOCVD or plasma-enhanced MOCVD ferroelectric deposition. (2) Use an initial growth step of plasma-enhanced MOCVD ferroelectric deposition prior to thermal MOCVD ferroelectric deposition. (3) Use plasma pre-treatment of the bottom electrode prior to sputtered or reactive sputtered ferroelectric deposition.A heuristic illustration of how low nucleation density impacts roughness and grain size is shown in FIGS. 11a–11d. These figures assume that nuclei grow three dimensionally with a roughly isotropic growth rate. SBT when grown in the crystalline phase will form in a very non-isotropic facetted manner. This will result in similar trends but different quantitative relationships between average film thickness, grain size, and surface roughness. Nucleation occurs randomly at the start as per FIG. 11a. During growth the nuclei grow until they impinge on each other, at which point grain boundaries are formed as in FIG. 11b. As the film becomes thicker the grains finally cover the surface of the film as shown by FIG. 11c. This is the low-thickness limit for producing functional devices; prior to this point, metal deposited on top will result in a metal/metal contact which will create a dead short. The peak to valley roughness at coalescence will be the height of the tallest grain. Further growth will in general result in absolute roughness values that are roughly constant although the scaled roughness (peak-to-valley/average thickness) will improve as illustrated by FIG. 11d. The impact of larger nucleation rates on grain size and surface roughness are shown in FIGS. 11e–11f. The higher nucleation density results in smaller grain sizes and also significantly smoother films for the same average film thickness. Because the coalescence point occurs at a smaller grain size, the low-thickness limit for functional devices is extended lower, to thinner films, than in the low-nucleation density case. The preferred embodiment treatment of the bottom electrode essentially textures the bottom electrode surface to provide more nucleation sites and thus a larger nucleation density. As described previously, an oxygen plasma treatment may even grow metal oxide on the electrode surface. Various process methods to implement plasma pre-treatment of the bottom electrode are as follows.(a) Ar and/or $O_2$ plasma generated by RF (e.g., 13.56 MHz) or microwave (e.g., 2.45 GHz) voltage applied to wafer surface in the MOCVD or plasma-enhanced MOCVD or sputter deposition chamber immediately after loading the wafer and immediately prior to starting MOCVD or sputter deposition. Performing the plasma treatment and PZT deposition without atmospheric exposure in between steps will prevent the surface from adsorbing other gases. The Ar and/or $O_2$ pressure could be 10 mTorr with a plasma bias of 100 volts for treatment of 2–5 minutes.(b) Ar and/or $O_2$ plasma generated by RF (e.g., 13.56 MHz) or microwave (e.g., 2.45 GHz) voltage in a pre-clean chamber clustered to the MOCVD or plasma enhanced MOCVD or sputter deposition chamber that occurs soon before the PZT deposition. Clustering the plasma treatment and PZT deposition will prevent the surface from adsorbing other gases.(c) Ar and/or $O_2$ plasma generated in an etch chamber separated from the deposition chamber. Plasma might be generated remotely or by applying a RF voltage to wafer or both can be used simultaneously. A remote plasma can be generated by RF, ECR, etc.Process methods to implement plasma enhanced MOCVD of the ferroelectric for the seed layer are as follows.Prior to thermal MOCVD the RF plasma is turned on with Ar and/or $O_2$ gas flowing into the chamber. The RF energy might be either remote and/or applied to the wafer surface. The precursors are then turned on into the deposition chamber. In order to maximize the nucleation rate and final film properties, the MOCVD process parameters for the plasma-enhanced process need to be optimized separately from the thermal MOCVD process. Therefore the pressure, carrier flows, oxidizer flows, liquid flows and perhaps liquid composition can be different from the thermal MOCVD process values. For the preferred embodiment method of initial plasma-enhanced MOCVD followed by thermal MOCVD, the plasma bias could be about 100 volts and the duration only seconds to insure at least partial surface coverage and high nucleation density.

Figure 12A:
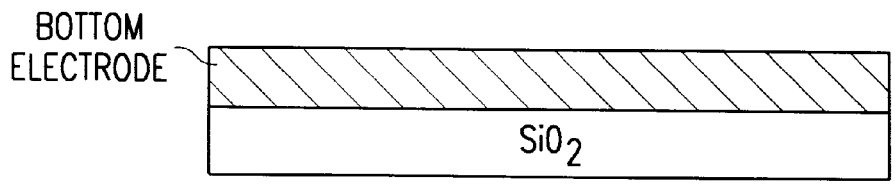
FIGS. 12a–12h illustrate seed layer for ferroelectric deposition.
Figure 12B:
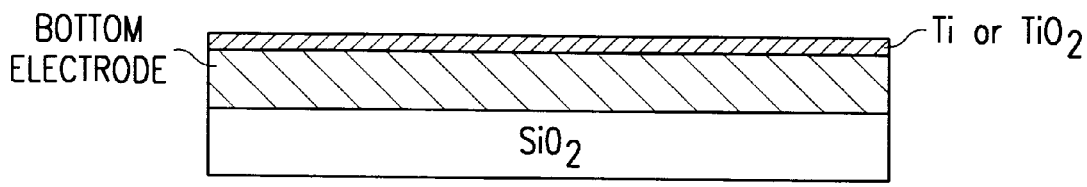
Figure 12C:
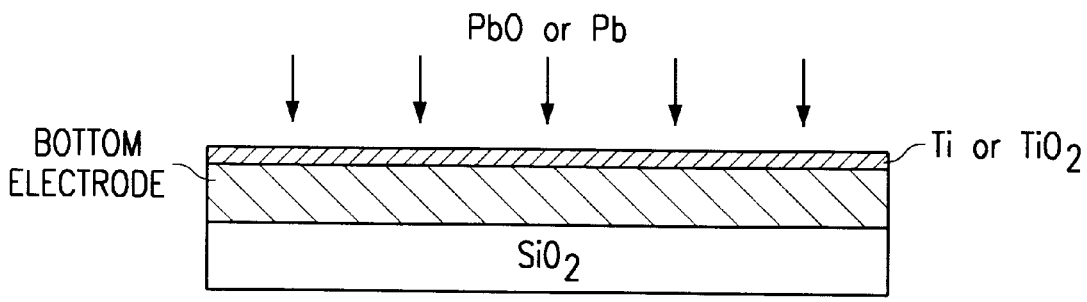
Figure 12D:
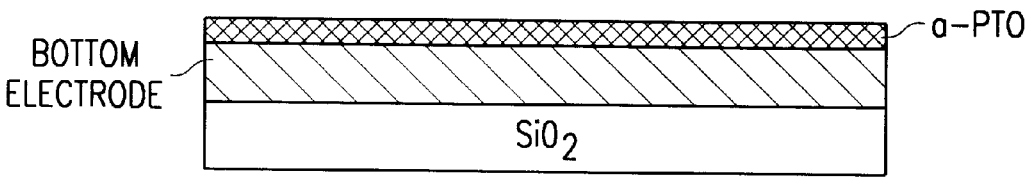
Figure 12E:
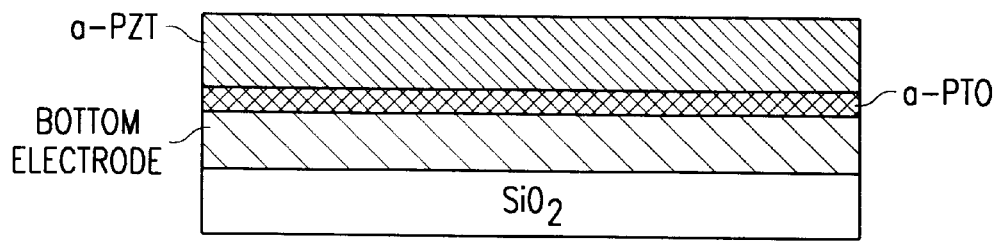
Figure 12F:
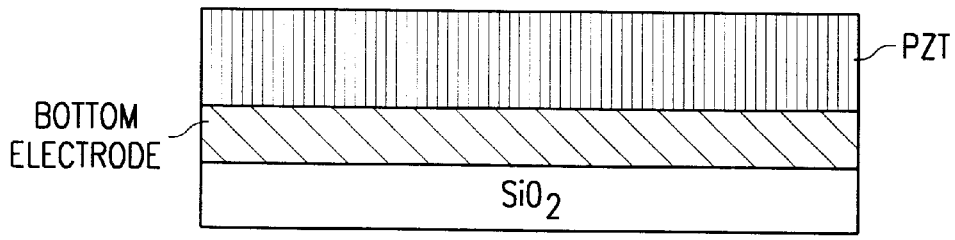
Figure 12G:
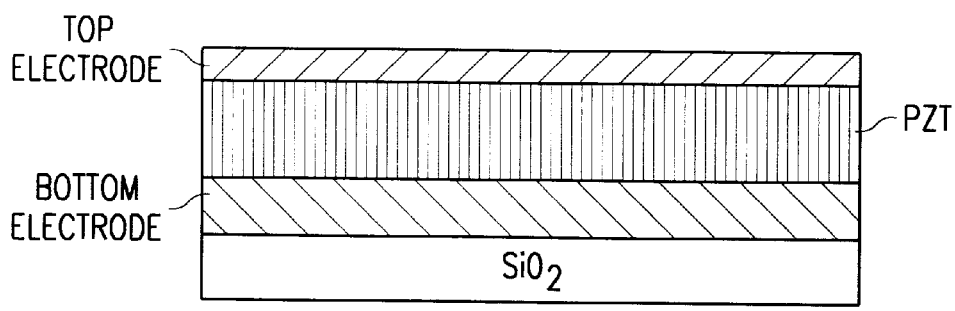
Figure 12H:
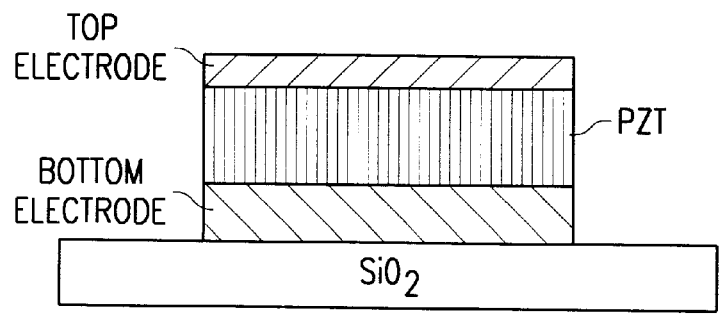

Sputtered Ferroelectric DepositionFor sputtered PZT deposition, the preferred embodiment grain structure control provides an amorphous lead titanate buffer layer prior to the PZT deposition. In particular, FIG. 12a shows a bottom electrode on oxide, the bottom electrode could be Ir, Pt, IrO2, etc.FIG. 12b shows a thin (5 nm) layer of Ti (or TiO2) formed on the bottom electrode, such as by CVD, sputtering, or e-beam evaporation.FIGS. 12c–12d illustrates sputtering PbO (or Pb) into the Ti (or TiO2) to form an amorphous PbTiO3 (a-PTO) layer containing 10–20% excess Pb atoms (over stoichiometric) and having a thickness of about 8 nm. FIG. 12e shows 250 nm thick layer of amorphous PZT (a-PZT) formed on the a-PTO by co-sputtering Pb($Zr_{0.5}Ti_{0.5}$)$O_3$ and PbO targets at 200 C. The PZT was crystallized at 500 C. (instead of 520 C. required without the PTO seed layer) or by rapid thermal annealing at 600 C. in an oxygen atmosphere for 20 seconds (FIG. 12f).FIG. 12g shows deposition of top electrode (Ir, Pt, IrO2, etc.) by sputtering or e-beam evaporation.FIG. 12h illustrates the stack etch to form the ferroelectric capacitor.

Alternative FerroelectricsThe PZT ferroelectric could be replaced by other perovskite ferroelectrics such as doped PZT, PZT with the lead replaced (at least in part) by Ca, Sr, Ba, Na, Li, K, La, Ce, Bi or combinations, PZT with the Zr and/or Ti replaced (at least in part) by Zr, Ti, Hf, Ta, Nb, Mn, Fe, Co, Ni, Al or combinations, and combinations of the replacements. Layered perovskites such as Bi4Ti3O12, SrBi2(Ta,Nb)O9, etc. may also be used. Further, paraelectric versions of these materials could be used for the dielectric of the first preferred embodiments.

Oxidized Metal Sidewall BarrierAn alternative to the sidewall diffusion barrier formation by deposition and anisotropic etching (steps (6)–(7) above) proceeds as follows. First conformally deposit metal such as titanium or aluminum to a thickness of 10–20 nm on the capacitor and dielectric; next, anisotropically etch the metal to leave a metal sidewall; and, lastly, oxidizes the metal to form the sidewall insulating diffusion barrier of TiO2 or Al2O3. Oxidize the metal sidewall with a low temperature (50 C.) oxygen plasma (10 Torr pressure and 100 V plasma bias); this avoids also oxidizing exposed TiAlN.This sidewall alternative allows use of an anisotropic metal etch which can be more selective to the other insulators than the anisotropic insulating diffusion barrier etch. The conformal metal deposition may be by TiCl4 thermal decomposition or sputtering Ti or Al to avoid hydrogen generation. The anisotropic etches may be plasmas of BCl3 and Cl2.

Thick TiAlN HardmaskThe foregoing preferred embodiments may be varied by using a thick (e.g., 200 nm) top TiAlN diffusion barrier also as the hardmask and eliminating the oxide hardmask. In this case the photoresist is stripped after the TiAlN top etch but prior to the Ir etch by switching to a gas flow of 92 sccm O2 and 8 sccm N2 at a pressure of 10 mTorr and 1500 W of MW power but 0 plasma bias. The top TiAlN will survive the bottom TiAlN strip due to its thickness. Also, the Ir and PZT etches may have N2 added to help deter hardmask erosion as with the previously described Pt etch of the first preferred embodiments.

Alternative Stacks and Plasma EtchesThe foregoing TiAlN/Ir/PZT/Ir/TiAlN capacitor stack and diffusion barrier materials and plasma etches may be modified in various ways including the following.(a) Presume a stack of Ir/PZT/Ir of thicknesses 50 nm/150 nm/150 nm on a stem with bottom diffusion barrier already formed baut with no top diffusion barrier/hardmask; any sidewall diffusion barriers will be formed after capacitor etching, and a top diffusion barrier will come with the top metal contact. Etch the stack using 900 nm thick photoresist and no hardmask as follows: first use a Cl2 plasma etch at 0.5 mTorr pressure and 50 sccm flow and high RF bias power (900 W) and MW power (1500 W) to etch the top Ir with the decrease of optical emission of Ir at 378 and 351 nm and the increase optical emission of PZT at 367 nm. Next, maintain the pressure and power but shift to flows of 10 sccm Cl2, 25 sccm CF4, and 50 sccm Ar to etch the PZT together with a 15 second overetch; detect the endpoint by optical emission decrease at 367 nm and the increase at 378 and 351 nm. Then repeat the foregoing Ir etch. Lastly, ash the photoresist in an asher.This etch can be summarized in the following table:

| Step | Cl2 Sccm | O2 sccm | N2 Sccm | CF4 sccm | Ar sccm | Press. (mTorr) | ECR (W) | RF (W) | Time | Comment |
|---|---|---|---|---|---|---|---|---|---|---|
| 1. | 50 | 0 | 0 | 0 | 0 | 0.5 | 1500 | 900 | OES | Ir TE etch: 351, 378 nm decrease; PZT 367 nm increases |

-continued

| Step | Cl2 Sccm | O2 sccm | N2 Sccm | CF4 sccm | Ar sccm | Press. (mTorr) | ECR (W) | RF (W) | Time | Comment |
|---|---|---|---|---|---|---|---|---|---|---|
| 2. | 10 | 0 | 0 | 25 | 50 | 0.5 | 1500 | 900 | OES | PZT etch, no O2; 367 nm dec. |
| 3. | 50 | 0 | 0 | 0 | 0 | 0.5 | 1500 | 900 | OES | Ir BE etch: 351, 378 nm decrease. |
| 4. | | | | | | | | | 45 min | Ash PR (in Branson asher). |

The foregoing table again uses the abbreviations OES, PR, BE, and TE, and the etches are performed at low temperatures (e.g., below 200 C.) with wafer backside cooling.(b) Presume a stack of TiN/Ir/PZT/Ir of thicknesses 50 nm/100 n/100 nm/100 nm on an already formed bottom diffusion barrier, any sidewall diffusion barriers will be formed after stack etching, and a top diffusion barrier will come with the top metal contact. Etch the stack by first oxidize the surface of the TiN and then pattern photoresist on the TiN:O. With the photoresist mask use a Cl2 plasma etch at 10 mTorr pressure and 50 sccm flow and low RF bias power (300 W) but high MW power (1500 W) to etch the top TiN:O with the decrease of optical emission at the 414 nm line for endpoint detection; include a 10 second overetch. Next, ash the photoresist in an oxygen plasma at 10 mTorr. Then drop the pressure to 0.5 mTorr with flows of 25 sccm Cl2 plus 25 sccm O2 and increase the RF bias power to 900 W to etch Ir and add a 15 second overetch; detect the endpoint by the decrease of optical emission of Ir at 378 and 351 nm and the increase optical emission of PZT at 367 nm. Then maintain the pressure and power but shift to flows of 10 sccm Cl2, 20 sccm O2, 25 sccm CF4, and 50 sccm Ar to etch PZT together with a 15 second overetch; detect the endpoint by optical emission decrease at 367 nm and the increase at 378 and 351 nm. Next, repeat the foregoing Ir etch, and then repeat the foregoing TiN:O etch to strip the exposed TiN:O.This etch system can be summarized in the following table:

| Step | Cl2 Sccm | O2 sccm | N2 Sccm | CF4 sccm | Ar sccm | Press. (mTorr) | ECR (W) | RF (W) | Time | Comment |
|---|---|---|---|---|---|---|---|---|---|---|
| 1. | 50 | 0 | 0 | 0 | 0 | 10 | 1500 | 300 | OES | TiN pattern; 414 peak, stop on Ir: 351, 378 nm increase. |
| 2. | 0 | 92 | 8 | 0 | 0 | 10 | 1500 | 0 | 3 min | Ash PR |
| 3. | 50 | 0 | 0 | 0 | 0 | 0.5 | 1500 | 900 | OES | Ir TE etch: 351, 378 nm decrease; PZT 367 nm increases |
| 4. | 10 | 0 | 0 | 25 | 50 | 0.5 | 1500 | 900 | OES | PZT etch: 367 dec. |
| 5. | 50 | 0 | 0 | 0 | 0 | 0.5 | 1500 | 900 | OES | Remove TiN, keep Ir TE intact: 414 peak, 351, 378 nm decrease |

The foregoing table again uses the abbreviations OES, PR, BE, and TE, and the etches may be at low temperatures with wafer backside cooling.The individual etch chemistries of the foregoing preferred embodiments can be varied as follows.For Ir the Cl2 etch can have O2 and N2 added; the O2 and N2 deter erosion of hardmasks such as TiAlN, but oxygen will erode softmasks. The N2 modifies the noble metal and helps increase sidewall slope. Of course, other gasses can be the sources of the Cl, O, and N species, such as OCl2, N2O, . . . , Other halogens (Br and I) could also be used in place of or in addition to the Cl.For PZT the Cl2+CF4+Ar etch can have O2 added and the mixture varied; the O2 addition helps deter loss of oxygen from the PZT. Of course, other gasses can be the sources of the Cl, F, Ar, and O species, such as OCl2, ClF2, . . . , Presumably, the Ar breaks the PZT bonds allowing the Cl and F to react to form volatiles products with the Pb, Zr, and Ti. The relative volatilities of the fluorides and chlorides vary for Pb, Zr, and Ti; so the composition of the PZT (Zr to Ti ratio) leads to selection of the F to Cl ratio.The following table summarizes various convenient gasses categorized according to function and which may be used as replacements or additions:

| Generic Chemistry | Embodiment | Further examples |
|---|---|---|
| Noble Gas | Ar | He, Ne, Ar, Kr, Xe |
| Chlorine Source | $Cl_2$ | $Cl_2$, $BCl_3$, HCl, $CCl_4$, $SiCl_4$, $C_xCl_y$, |
| Fluorine Source | $CF_4$ | $SF_6$, $NF_3$, $F_2$, $XeF_2$, HF, $C_XF_Y$ |
| Chlorine + Fluorine Source | ClF | ClF, $CCl_2F_2$, $C_XF_YCl_Z$, |
| Oxygen Source | $O_2$ | $O_2$, $H_2O$, CO, $CO_2$, NO, $N_2O$ |
| Noble Metal Modifiers | $N_2$ | NO, CN |
| Alternate Halogens | $Br_2$ | $Br_2$, HBr, $I_2$, HI, IBr |

Figure 9A:
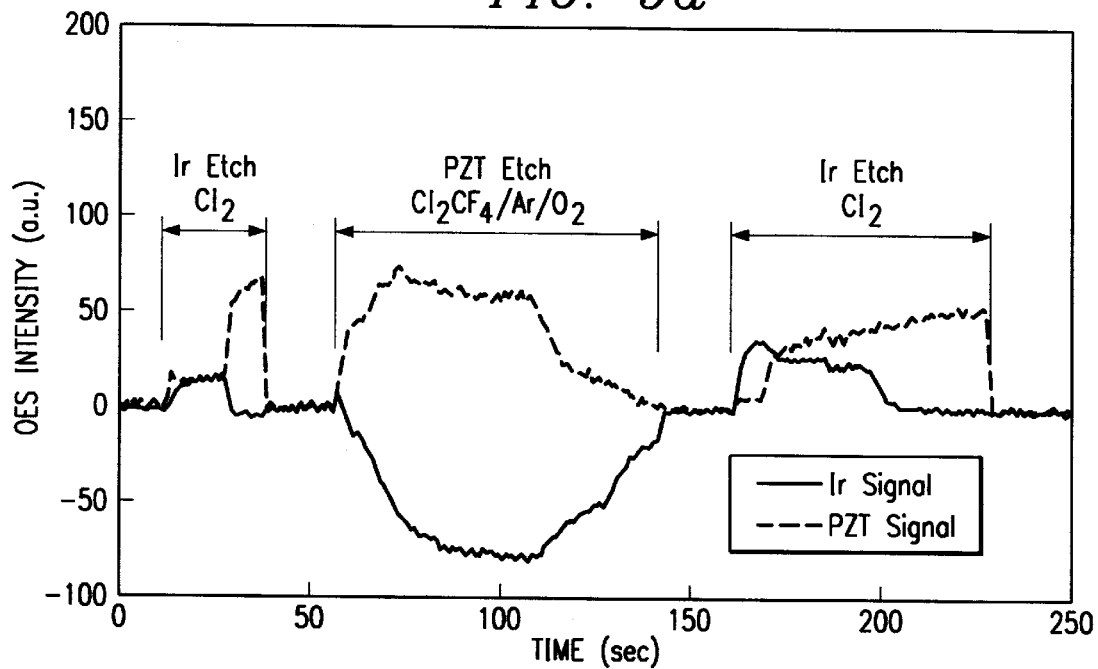
FIGS. 9a–9f illustrate remote endpoint detection in a stack etch.
Figure 9B:
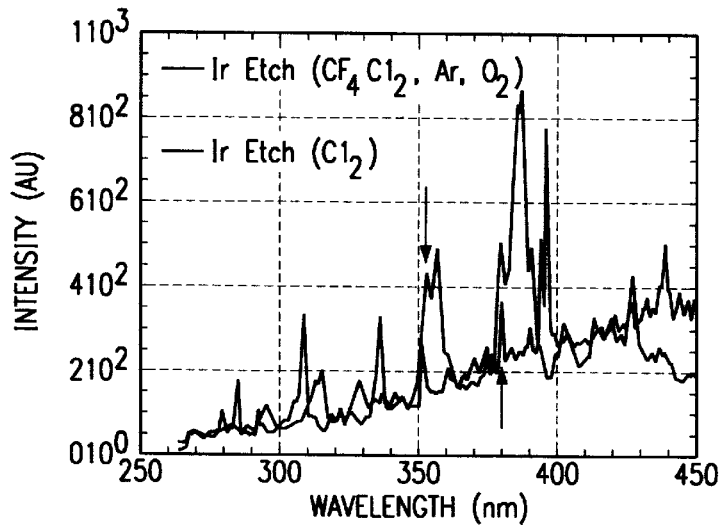
Figure 9C:
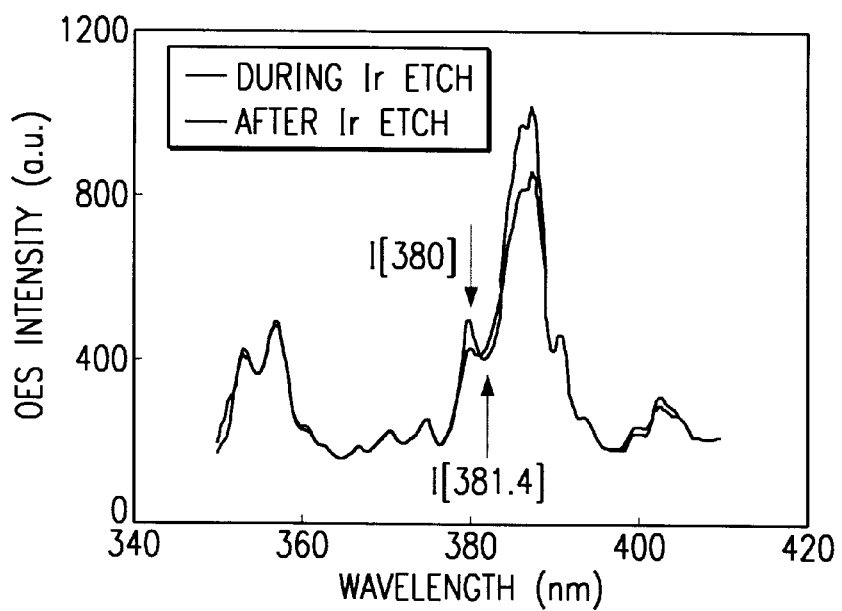
Figure 9D:
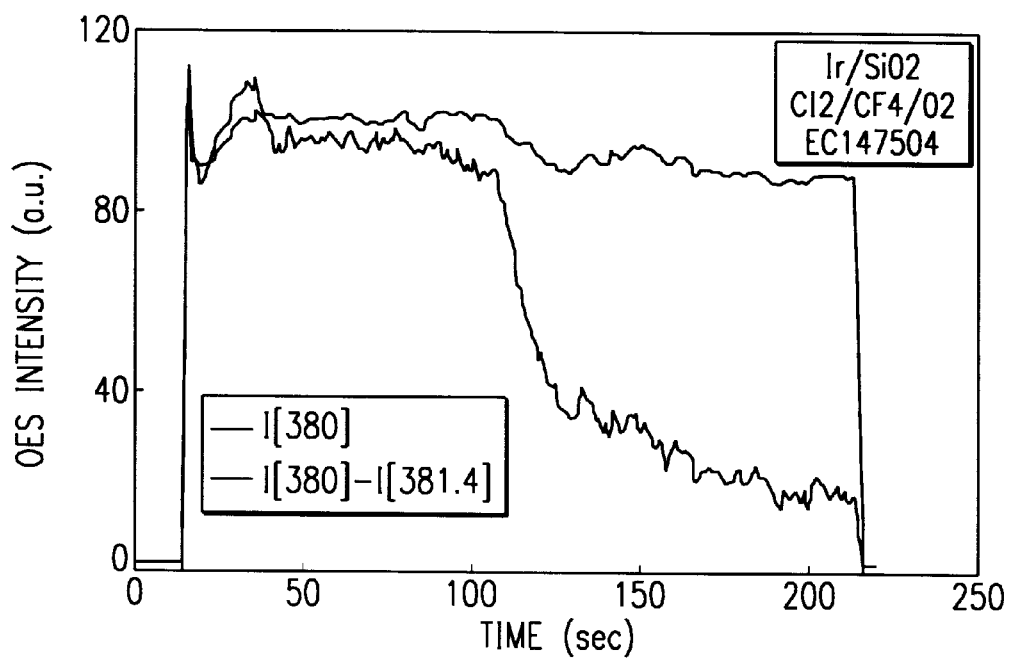
Figure 9E:
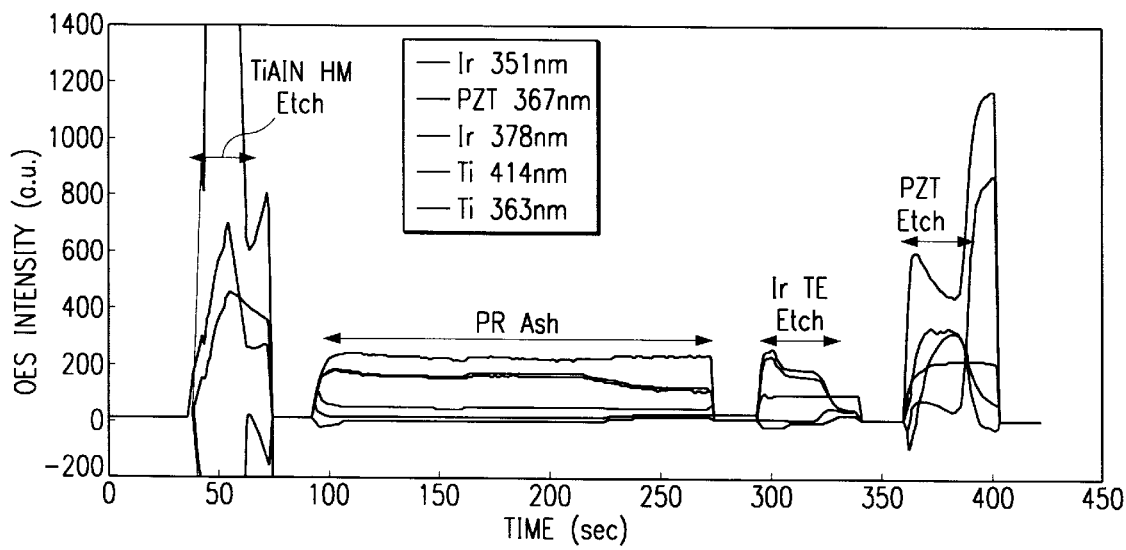

For diffusion barriers (conducting top and bottom TiAlN and insulating sidewall TiO2), the low pressure, high bias Cl2 plasma etch can be replaced with a low pressure (0.5 mTorr), high bias (ECR reactor with 1500 W MW power and 900 W RF bias power) plasma of Cl2 (10 sccm), CF4 (25 sccm), and Ar (50 sccm). Adding oxygen to this barrier etch yields the PZT etch; this provides convenient multistep etches.It is best if the etch process for each layer has a reasonable selectivity for the underlying layers. This allows the use of a more liberal overetch of each layer prior to etching subsequent layers. This overetch will help compensate for non-uniformity in etch rates across the wafer. Under the best case conditions, the non-uniformity of the final etch will be only a little worse than the nonuniformity in the etch process of the last material and not be a combined total of all of the etch processes.In terms of maximizing the sidewall profile of materials with low volatilities such as noble metals (Ir, IrO2, Pt, for example), a large overetch is also desirable. This overetch can only be done if the selectivity between the hardmask and etched material is large. In addition, a large selectivity to the underlying materials is necessary for a large overetch.The choice of materials for hardmask materials is very dependent on etch chemistries, etch processes and resulting etch selectivities. The choice of electrode materials and ferroelectrics is usually determined by optimum properties. The optimum hardmask material is simple to deposit, can be chemically etched to achieve sharp profile yet under etch conditions that work well for underlying materials etches has a good selectivity (low etch rate). The hardmask must also either be easily removed or must be useful or at least not cause problems for further processing.Etch recipes used to demonstrate etch selectivities.

shifts. The Ir etch is Cl2 and the PZT etch is Cl2+CF4+Ar+O2, and both Ir and PZT related OES signals are monitored. The changes in OES signals determine etch step endpoint, and the preferred embodiments then add a timed overetch followed by a plasma off time for gas mixture switching and then plasma re-ignition and the next etch step. This allows automatic process control.In more detail, FIG. 9b shows the OES signals that occur during the Ir etch step under two different chemistries. Light emission occurs during plasma etching as, for instance, etch products are excited by electrons or ions in the plasma. Two Ir emission bands (350–352 nm and 378–380 nm) are available, and can be further enhanced with various background subtraction techniques: FIG. 9c illustrates the during and after Ir etch spectra, and FIG. 9d the 380 nm intensity minus the 381.4 nm intensity as a function of time about the endpoint. The large change of the background subtracted signal clearly indicates the endpoint. Other material-specific wavelengths can be used, depending upon the materials in the stack, and the etch chemistry (which can affect both the nature of the emitting species and the spectral region in which observation of the target species is not obscured). Some emission wavelengths are very sensitive to particular etching materials (e.g., 380 nm for Ir etching in Cl2 chemistries), while others are not. Other wavelengths are indirectly related to the etched species (e.g., CO emission at 438.5 nm during oxide etch), but are still useful process monitors.FIG. 9e illustrates OES traces for five emission lines during a stack etch in which the photoresist used to mask the hardmask etch (TiAlN HM Etch) is stripped (PR Ash). In particular, the TiAlN etch endpoint is on the TiAlN and Ir (top electrode) signals, the photoresist ash is timed, the Ir top electrode endoint is on the Ir and PZT signals, and the PZT etch endoint is on the PZT

| Recipe | $Cl_2$ (sccm) | $CF_4$ (sccm) | $CF_3H$ (sccm) | $O_2$ (sccm) | $N_2$ (sccm) | Ar (sccm) | Pressure (mTorr) | RFPwr (Watts) | ECRPwr (Watts) |
|---|---|---|---|---|---|---|---|---|---|
| D-Via |  | 15 | 30 |  |  | 100 | 100 | 750 | — |
| EtchSiO2 |  | 45 |  |  | 5 |  | 0.5 | 100 | 1500 |
| Ir-TE | 50 |  |  |  |  |  | 0.5 | 900 | 1500 |
| PZTnoO2 | 10 | 25 |  | 20 |  | 50 | 0.5 | 900 | 1500 |
| HP-PZT | 10 | 25 |  | 20 |  | 50 | 10 | 300 | 1500 |
| Ir-TE-O2 | 25 |  |  | 25 |  |  | 0.5 | 900 | 1500 |
| PZT-O2 | 10 | 25 |  |  |  |  |  |  |  |

Examples of etch selectivities

| | | Etch Rates | | (A/min) | | | |
|---|---|---|---|---|---|---|---|
| Machine | Recipe | PR | $SiO_2$ | TiAlN:O | TiAlN | PZT | $TiO_2$ | Ir |
| AMAT | D-Via | 1230 | 1760 |  |  |  | 100 |  |
| PQ | EtchSiO2 | 1775 | 1715 |  |  |  |  |  |
| PQ | Ir-TE | 2100 | 760 | 1450 | 2650 | 1050 | 640 | 2800 |
| PQ | PZTnoO2 | 4100 | 1215 | 560 |  |  | 480 | 2100 |
| PQ | HP-PZT |  |  |  |  |  | 600 | 2600 |
| PQ | Ir-TE-O2 |  |  | 100 | 100 | 800 |  | 1600 |

Endpoint DetectionFIG. 9a illustrates the optical emission spectroscopy (OES) signals for an Ir/PZT/Ir stack etch with a 20-second off time for the plasma during gas mixture and Ir (bottom electrode) signals.Experiments as in the following table were performed using OES endpoint detection except for photoresist ash:

| Step | Cl2 sccm | O2 Sccm | N2 sccm | CF4 sccm | Ar sccm | Pres. (mTorr) | ECR (W) | RF (W) | Time | Comment |
|---|---|---|---|---|---|---|---|---|---|---|
| 1. | 50 | 0 | 0 | 0 | 0 | 0.5 | 1500 | 900 | OES | Etch exposed TiAlN OES 414 nm decrease. |
| 2. | 0 | 92 | 8 | 0 | 0 | 10 | 1500 | 0 | 3 min | Ash PR |
| 3a. | 25 | 25 | 0 | 0 | 0 | 0.5 | 1500 | 900 | OES | Ir TE etch with O2: 351, 378 nm decrease; PZT 367 nm increases |
| 3b | 25 | 25 | 10 | 0 | 0 | 0.5 | 1500 | 900 | OES | Ir TE etch w/O2 & N2:. |
| 4a | 10 | 20 | 0 | 25 | 50 | 0.5 | 1500 | 900 | OES | PZT etch w/O2 |
| 4b | 10 | 0 | 0 | 25 | 50 | 0.5 | 1500 | 900 | OES | PZT etch no O2 |
| 4c | 10 | 20 | 10 | 25 | 50 | 0.5 | 1500 | 900 | OES | PZT etch w/N2 |
| 4d | 10 | 20 | 0 | 25 | 50 | 0.5 | 1500 | 300 | OES | Lo bias PZT etch w/ O2 |
| 5 | 50 | 0 | 0 | 0 | 0 | 10 | 1500 | 300 | OES | TiAlN remove; 414 or 363 nm peak |

Figure 9F:
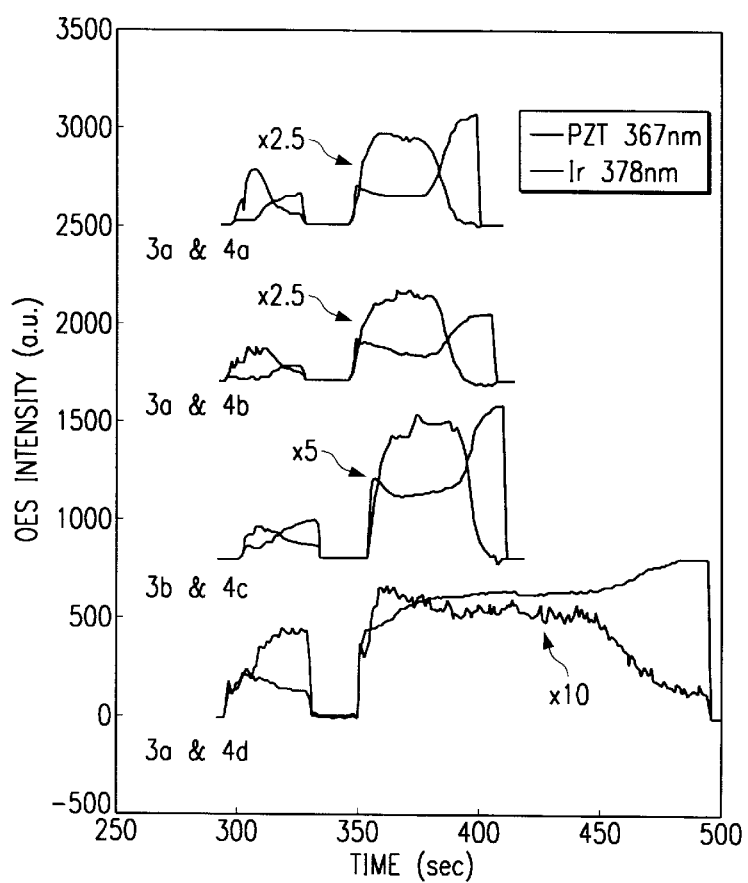

The foregoing table of etch variations had the OES signals for the Ir top electrode and PZT etches as shown in FIG. 9f. Note that the combination step 3a and step 4d resulted in most of the top electrode being lost and also a anamolous signal traces in FIG. 9f (bottom traces).Alternatively, the RF harmonics could be used for endpoint detection analogous to FIG. 5b. Further, reflectometry or spectral reflectometry or mass spectrometry could be used for endpoint detection.In general, these endpoint detection methods sense one of: (1) the gas environment (OES, mass spectrometry), (2) the plasma characteristics (RF power harmonics, electron energy distribution, discharge current), and (3) etched wafer characteristics (reflectormetry). The following table summarizes various convenient methods:

| General Sensing Method | Preferred Embodiments | Other Specific Techniques |
|---|---|---|
| Gas Environment | Optical emission spectroscopy (OES); Mass spectrometry (in situ) | Residual gas analysis (downstream) |
| Plasma Environment | RF power harmonics; Electron energy distribution | RF current harmonics; Discharge current measurement |
| Wafer State Measurement | Reflectometry; scatterometry; Ellipsometry | Spectral reflectometry; Spectral ellipsometry; X-ray fluorescence |

Figure 10A:
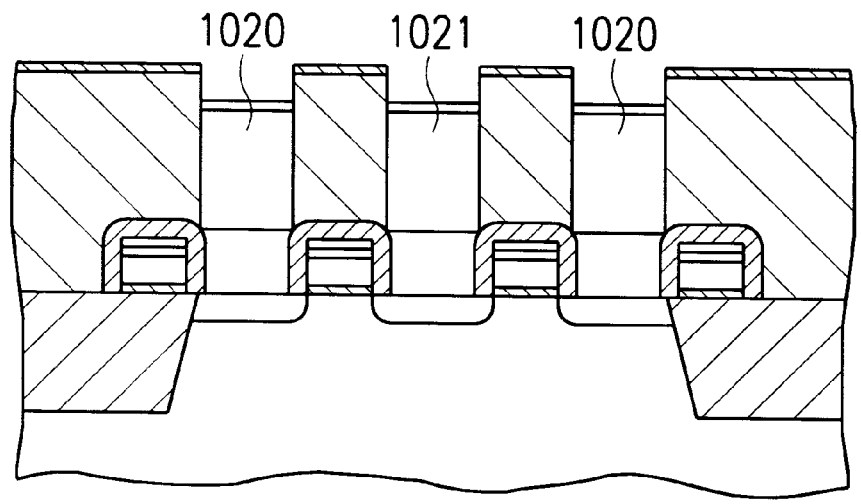
FIGS. 10a–10d show a capacitor under bitline preferred embodiment.
Figure 10B:
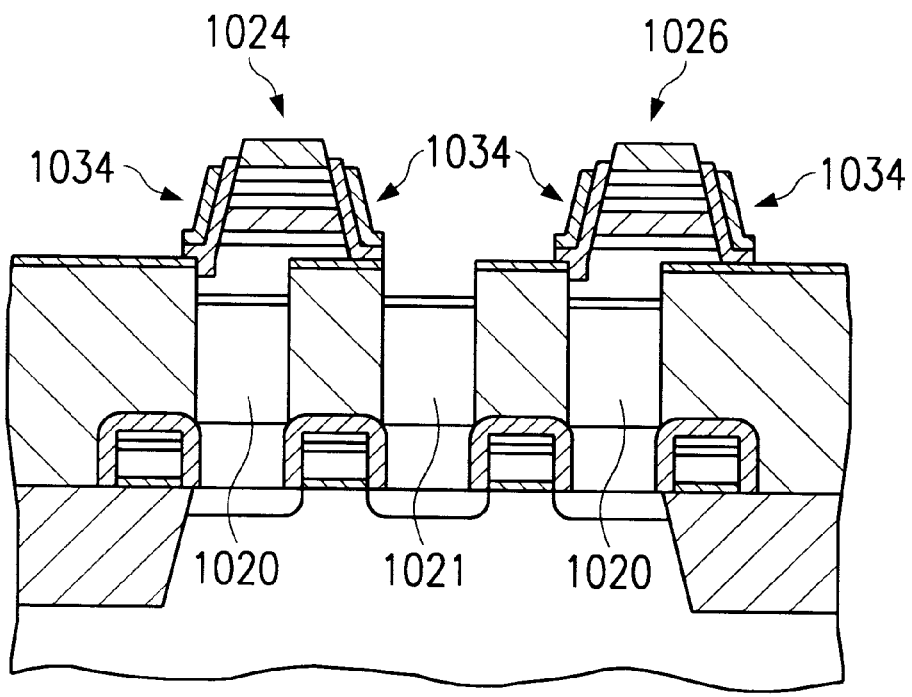
Figure 10C:
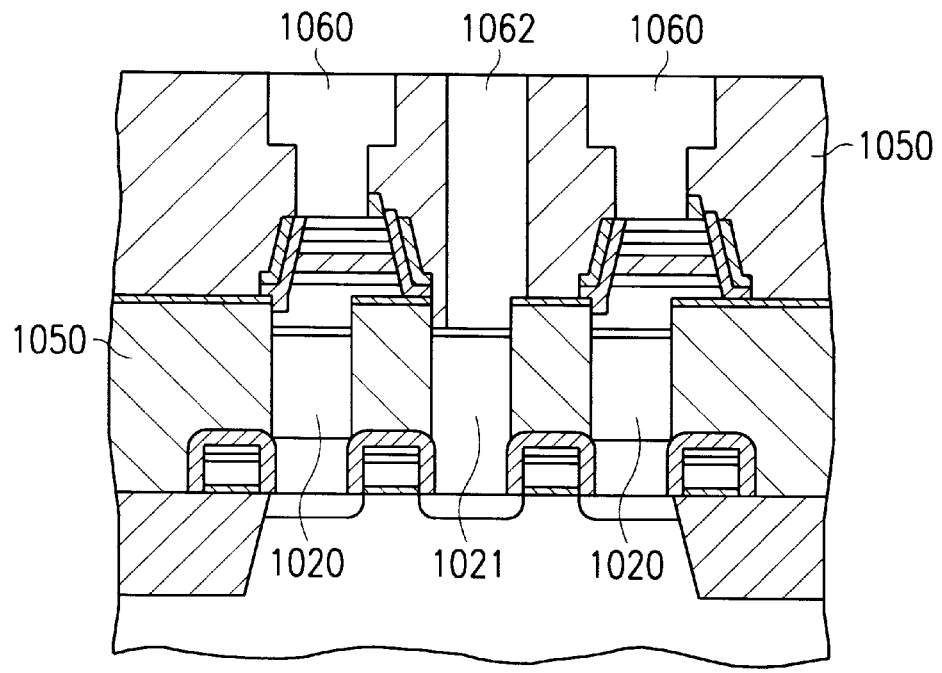
Figure 10D:
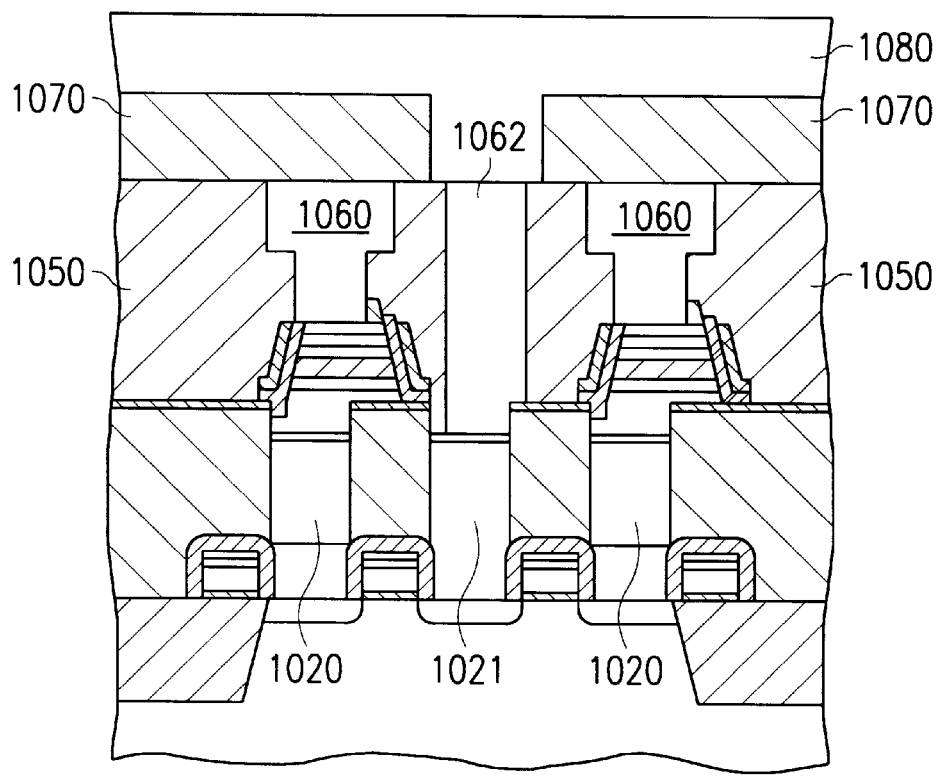

Softmask Stack EtchFor low density ferroelectric capacitors as could be used in smart cards, a softmask (photoresist only mask on Ir/PZT/Ir or Pt/SBT/Pt stacks) preferred embodiment two-step etch may be used. In particular, photoresist-only mask etching of Pt or Ir with Cl2 plus etching PZT or SBT with Cl2 plus O2 leads to redeposition on the photoresist sidewall, forming the fence of residues which is difficult to remove. The preferred embodiment softmask stack etch uses a two-step etch process. During the first step, performed at a pressure of 0.5 mTorr and a MW power of 1500 watts and RF power of 900 watts, etch the top Pt or Ir with Cl2 at 50 sccm, next etch the PZT or SBT with Cl2 at 25 sccm plus O2 at 25 sccm, then etch the bottom Pt or Ir again with Cl2 at 50 sccm through to the underlying dielectric (e.g., oxide). Then increase the pressure to about 10 mTorr and continue for a 20% overetch. The higher pressure leads to an enhanced photoresist removal rate, which, in turn, serves to remove the residue fence. This approach yields sidewall slopes about 60 degrees with no fence using standard photoresist processing.This two-step etch has the advantages of omitting the hardmask layer deposition and etch steps while still providing a sufficiently steep sidewall so that the self-aligned diffusion barrier as previously described in connection with FIGS. 7a–7d can be formed. Capacitor Under BitlineAs with the first preferred embodiments, the second preferred embodiments adapt to a capacitor under bitline structure fabricated in a manner analogous to that illustrated in FIGS. 4a–4h. In particular, as previously described first form capacitor stems 1020 plus also bitline stems 1021 as illustrated in FIG. 10a. Next, form capacitors 1024 and 1026 with sidewall insulating diffusion barriers 1034 as shown in FIG. 10b. This employs one of the foregoing stack depositions, stack etches, and sidewall insulating diffusion barriers. FIG. 10b illustrates the silicon oxynitride hardmask case.Deposit interlevel dielectric 1050 and form drive lines with a dual damascene process as follows. First etch via down to the bitline stems and capacitor top electrodes (through any insulating hardmasks on the top electrodes). Then etch trenches for drive lines which parallel the word lines. Lastly, fill the vias and trenches with metal (diffusion barriers plus copper) and planarize with CMP to form the drive lines 1060 and filled vias 1062 to the bitline stems; see FIG. 10c. Deposit interlevel dielectric 1070 and form bitlines with a dual damascene process as follows. First etch vias down to the filled vias on the bitline stems. Then etch trenches for bitlines which are perpendicular to the drive lines and the word lines. Lastly, fill the vias and trenches with metal (diffusion barriers plus copper) and planarize with CMP to form the bitlines 1080; see FIG. 10d.

Figure 8:
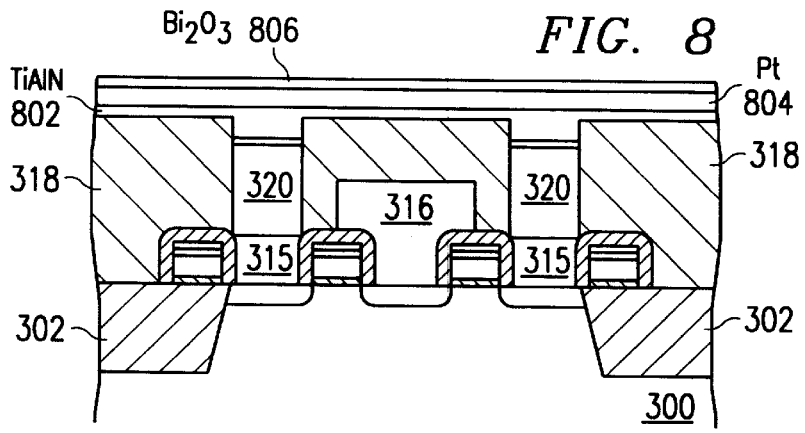
FIG. 8 shows a third preferred embodiment step.

Third Preferred EmbodimentsFIG. 8 illustrates in cross sectional elevation views the new step of third preferred embodiments methods for fabrication of integrated circuits (e.g., CMOS or BiCMOS) with capacitors or memory cells (e.g., FeRAM cells) as follows.(1) Follow step (1) of the second preferred embodiments (which is the same as steps (1)–(7) of the first preferred embodiments).(2) Sputter deposit 30 nm thick layer 802 of $Ti_{0.6}Al_{0.4}N$ (bottom conducting diffusion barrier) and then sputter deposit 50 nm thick layer 804 of Pt (bottom electrode). Annealing the Pt can increase grain size and modify subsequent SBT characteristics.(3) [26218] Load Pt 804 with bismuth by spin coating 5 ml (for a 6 inch wafer) of a 0.04M solution 806 of $Bi(OAc)_3$ in a mixture of pyridine and acetic acid (ratio of pyridine to acetic acid of 1 to 2.9 by weight) and drying at 300 C. for 5 minutes. Then diffuse Bi into the surface region of the Pt by firing at 700 C. for 60 minutes; see FIG. 8. The firing time will determine the amount of Bi infused into the Pt. Then wet clean off the residue (e.g., Bi2O3) with basic oxide etch or a water mixture of HCl/HNO3/HF.(4) Form the SBT layer on the Bi-infused Pt as follows. Prepare precursors by mixing bismuth acetate in pyridine and separately dissolving strontium acetate and tantalum ethoxide in glacial acetic acid. Then combine the solutions and spin coat the wafer. Dry at 300 C. for 5 minutes and then fire at 700 C. in flowing oxygen; this crystallizes the layered perovskite phase. Multiple layers of SBT may be formed to attain a final thickness of about 170 nm. The preloading of the Pt electrode with Bi allows use of a precursor solution with the desired stoichiometric ratio for the SBT without having to compensate for the Bi that would otherwise diffuse out into the Pt. In particular, a mole ratio of 0.9 to 2.1 to 2.0 for Sr to Bi to Ta yields good electrical properties such as large switchable polarization, low coercive voltage, and low operating voltage.(5) Sputter deposit a 40 nm thick layer of Pt (top electrode), then sputter deposit a 50 nm thick layer of $Ti_{0.6}Al_{0.4}N$ (top conducting diffusion barrier). The top TiAlN will also act as a hardmask for the subsequent stack etch.(6) Anneal at 550–700 C. in a N2 atmosphere; the anneal improves the SBT characteristics provided that significant Bi is not lost.(7) Continue as in steps (4)–(14) of the second preferred embodiments. The low pressure Cl2+O2+N2 plasma also etches SBT.

Alternative Bismuth Loading of Bottom ElectrodeStep (3) of the foregoing provided for bismuth infusion into the Pt bottom electrode prior to deposition of SBT. An alternative to the spin coating method would be to transport Bi by gas phase; that is, use MOCVD to deposit Bi on Pt bottom electrode and diffuse the Bi into the Pt by an anneal. Afterwards, any residual Bi compounds can be stripped in an acid solution. Also, annealing in an atmosphere saturated with Bi could be direct gas phase doping of the Pt. Bi has a vapor pressure of about 20 mTorr at 700 C.Alternatives include co-sputter Pt and Bi to form the bottom electrode, and then just use the SBT formation as in step (5). The bottom electrode could have a composition on the order of 1% Bi. Further, the co-sputtering may be replaced by a simpler sequential sputtering process: sputter 10–20 nm Pt, then 1 nm Bi (full coverage is not necessary, this is just an average thickness), then 10–20 nm Pt. In this case the Bi diffuses in the Pt during SBT recrystallization.

Alternative Bismuth Evaporation DeterrenceAn alternative embodiment provides a Bi atmosphere for the recrystallization anneal of the SBT; this helps maintain the stoichiometry of the SBT against Bi evaporation. Alternative preferred embodiments add to or replace the Bi atmosphere as follows:(a) Form a graded composition SBT with the bismuth content greater than stoichiometric near the top surface to compensate for subsequent evaporation during recrystallization. For example, with a 150 nm thick SBT layer of composition ratios of Sr=0.9, Bi=2.1, Ta=2.0 the top 5–10 nm could have Bi increased to 2.3 for sufficient excess Bi to compensate for the expected evaporation during a 700 C. anneal. More accurately, the initial SBT layer could have the Bi depending on distance from the surface, so that diffusion plus evaporation during recrystallization will yield an essentially uniform Bi content.(b) After deposition and curing of the SBT layer but before recrystallization, deposit a 10–20 nm thick layer of Bi2O3. Then recrystallize at 700 C., the Bi2O3 (m.p. about 825 C.) provides a Bi source directly on the SBT surface and prevents Bi evaporation. After the recrystallization, strip the Bi2O3.(c) After deposition and curing of the SBT layer but before recrystallization, deposit a 20 nm thick layer of silicon nitride by PECVD. Then recrystallize at 700 C., the silicon nitride provides a Bi diffusion barrier directly on the SBT surface and prevents Bi evaporation. After the recrystallization, strip the silicon nitride with phosphoric acid.(d) Perform the SBT curing (200 C.) but defer the recyrstallization anneal until after the top electrode and conducting diffusion barrier (e.g., Bi-doped Pt and TiAlN) have been deposited. The Bi-doped Pt plus TiAlN act form a Bi diffusion barrier to deter Bi evaporation during the recyrstallization anneal.

Figure 13A:
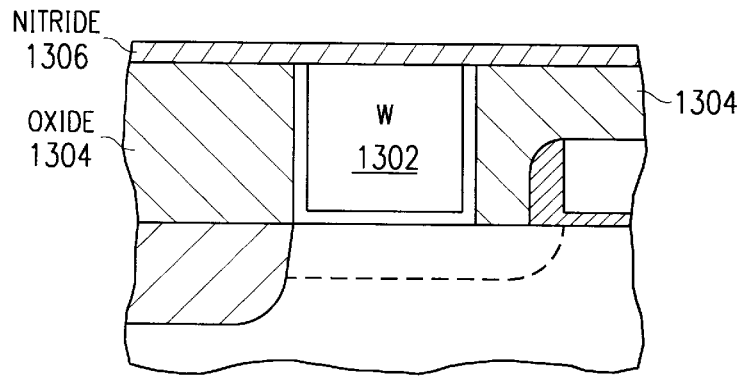
FIGS. 13a–13i are cross sectional elevation views of a three dimensional capacitor fabrication.
Figure 13B:
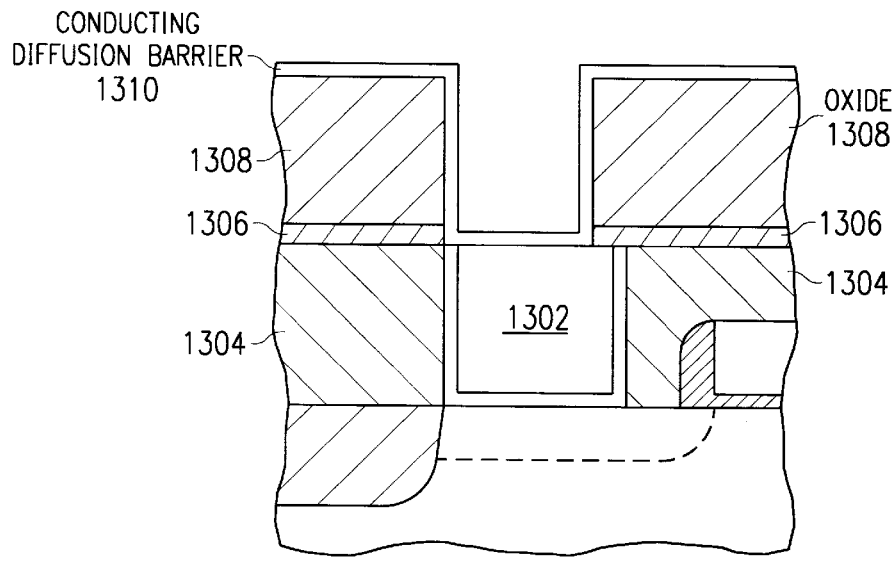
Figure 13C:
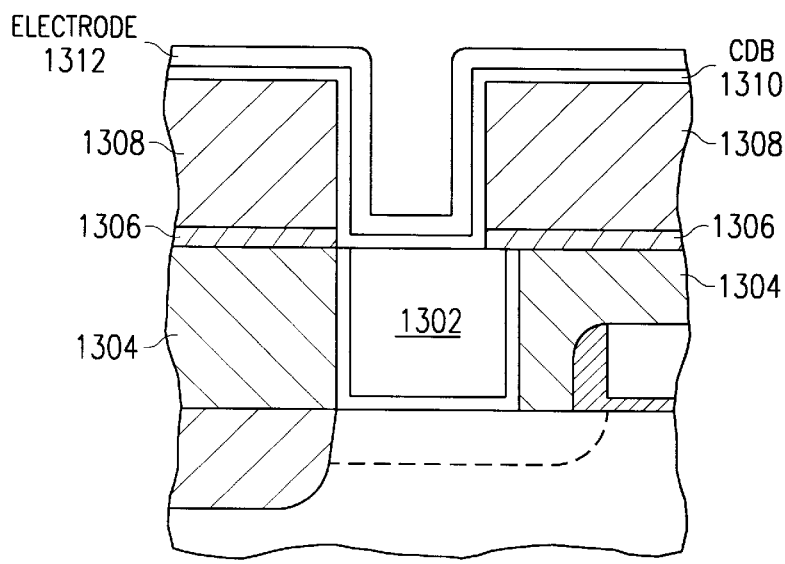
Figure 13D:
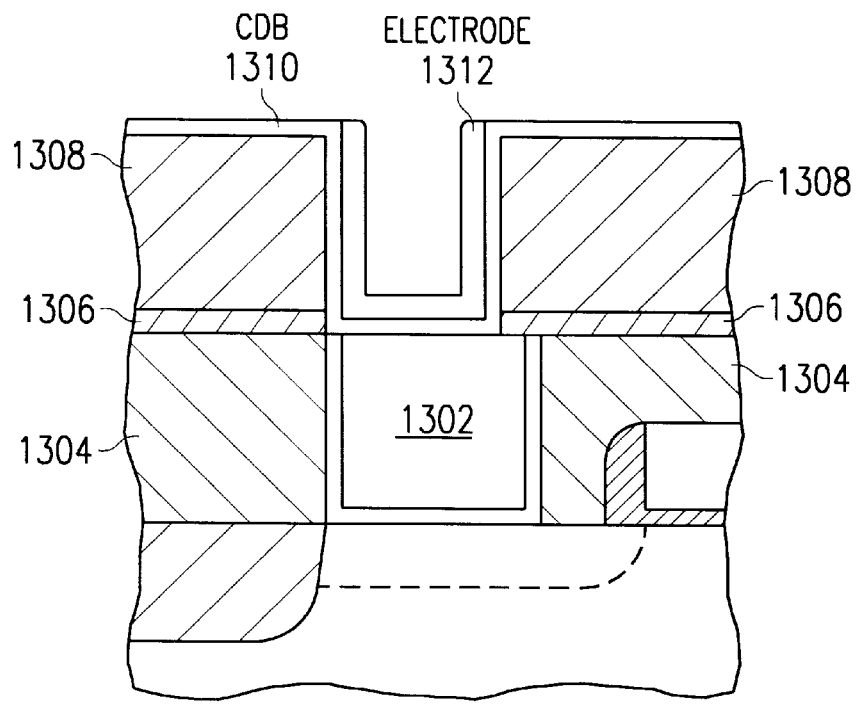
Figure 13E:
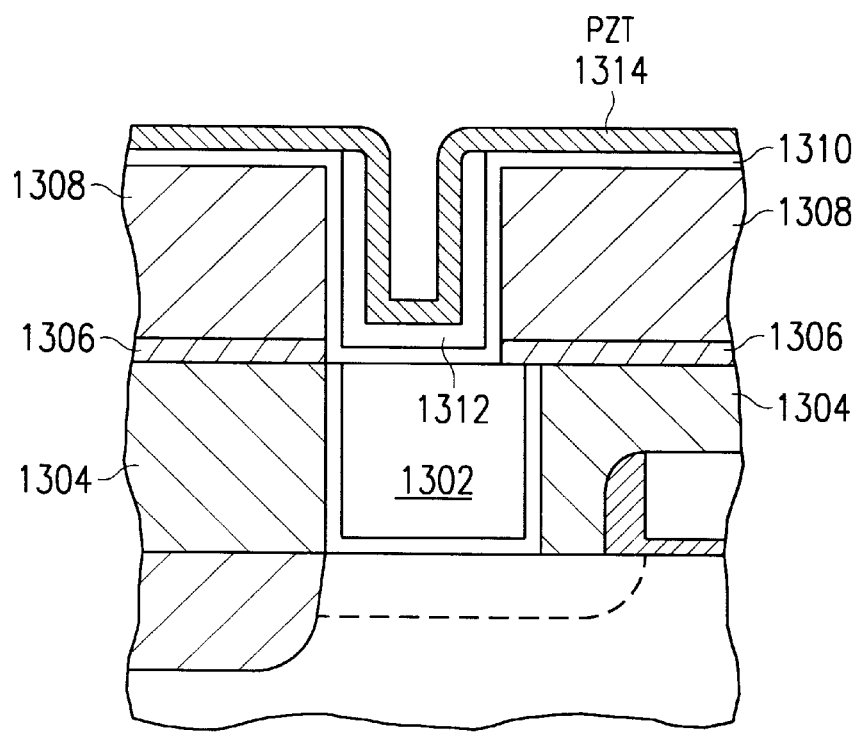
Figure 13F:
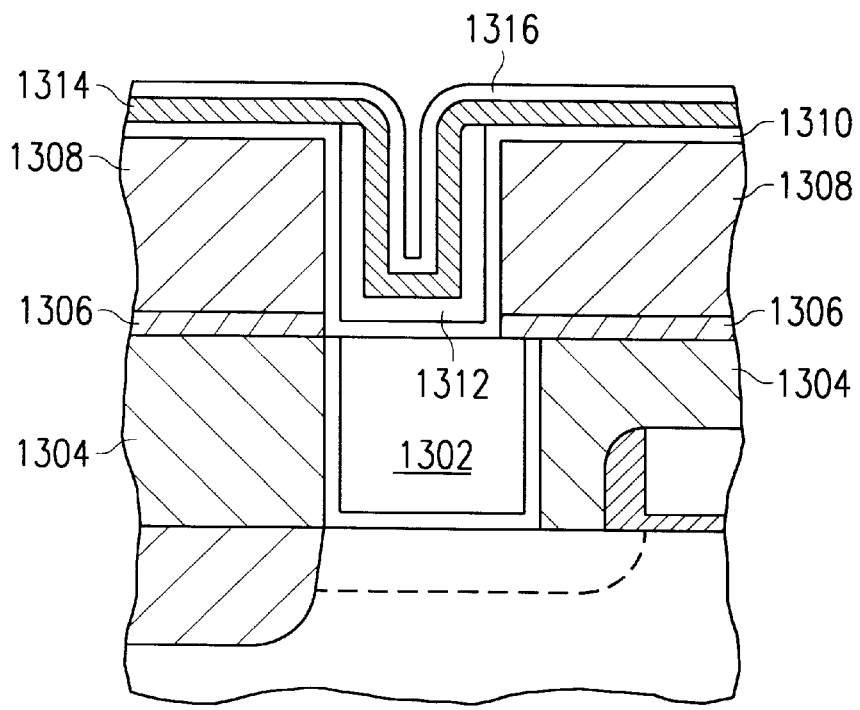
Figure 13G:
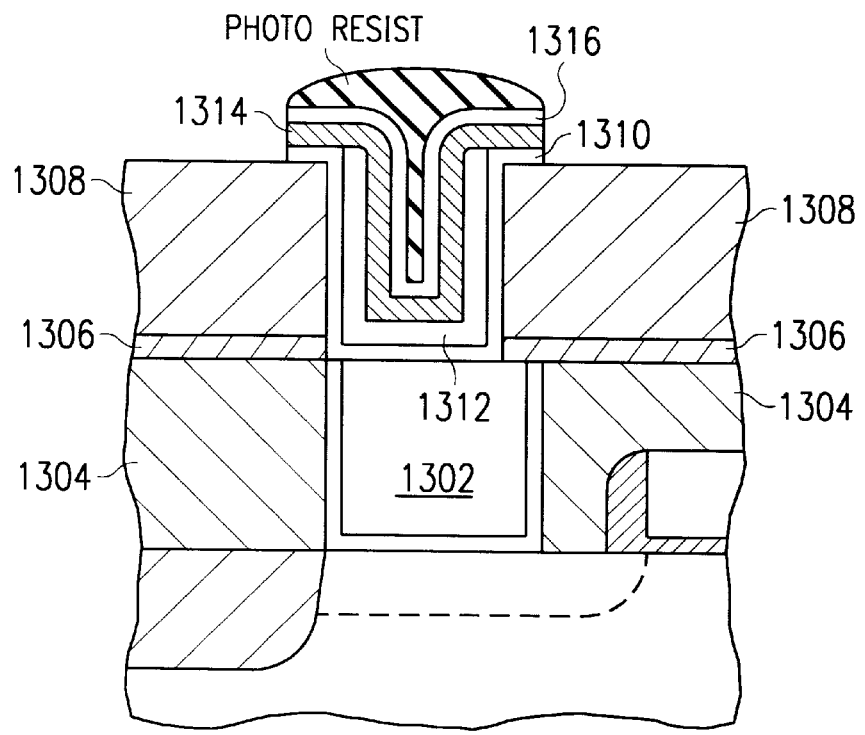

Three Dimensional CapacitorFIGS. 13a–13h Illustrate a fourth preferred embodiment PZT or SBT capacitor extending in three dimensions in the shape of a cup instead of the planar capacitors of FIGS. 6a–6f, 10a–10d. The fourth preferred embodiment may be fabricated as follows. (1) Start with planar tungsten (W) plug 1302 in a via in interlevel dielectric (ILD) 1304 which may be silicon dioxide. Plug 1302 is formed using CVD W followed by a CMP step. ILD 1304 is typically 1 um thick and plug 1302 is typically less than 0.2 um in diameter. Thin silicon nitride layer 1306 is deposited as an etch stop; see FIG. 13a. (2) Second ILD layer 1308 is deposited. The thickness of ILD 1308 is dependent upon the depth required of the cup structure for the desired resulting capacitance (switched charge). For example, for feature size F=0.1 um, the depth determined by the minimum charge condition (32 fC) is 0.2 um if the cup is a circular cylinder of diameter 1.9 F. The desired switched charge may be 32 fC which may be achieved with a capacitor area of 0.08 $um^2$ by a switched polarization density of 40 $uC/cm^2$. Following ILD 1308 deposition (which could be SiO2 or some low-k material), a deep ultraviolet lithography approach is used to define an opening in a spun-on photoresist layer. An SiO2 etch is employed to etch the SiO2 dielectric while stopping on silicon nitride layer 1306. A second etch chemistry is then used to etch thin SiN layer 1306. The wafer is then cleaned. A conducting diffusion barrier 1310 (CDB), typically TiAlN, TiSiN, TaN, or similar material, is deposited using a CVD approach. The thickness of this CDB layer is typically 10–20 nm; see FIG. 13b. (3) Following CDB 1310 deposition, the cup structure is now ready for CVD electrode deposition. In most cases, a noble metal electrode (Pt, Ir, etc.) is used although a more complex metal-oxide (RuO2, SrRuO3) could also be used. The electrode layer 1312 is deposited to a thickness of approximately 20 nm; see FIG. 13c. For an SBT ferroelectric, Bi loading could now be performed.(4) A metal CMP process is employed to remove the portion of electrode layer 1312 outside of the cup region while stopping on conducting diffusion barrier layer 1310; see FIG. 13d. (5) The ferroelectric material 1314, typically PZT, is then deposited using a CVD approach. This deposition is done at a temperature of approximately 550 C. in an oxygen ambient, although the variations previously described could be used. The ferroelectric thickness is typically 20–60 nm; see FIG. 13e. (6) The top electrode material layer 1316, which is typically similar in composition to the bottom electrode, is deposited using CVD. The top electrode may be deposited so that it is oxygen rich, which could improve device performance and reliability; see FIG. 13f. (7) A deep ultraviolet lithography approach is then employed to etch the ferroelectric stack materials. A photoresist stack etch mask is shown in FIG. 13g, although hardmasks such as TiAlN could be used. This etch requires a high-power RIE with varying chemistry as previously described; see FIG. 13g. (8) Following stack etch, an insulating diffusion barrier (Al2O3, AlN, etc., typically 10 nm thick) is deposited using CVD.

Figure 13H:
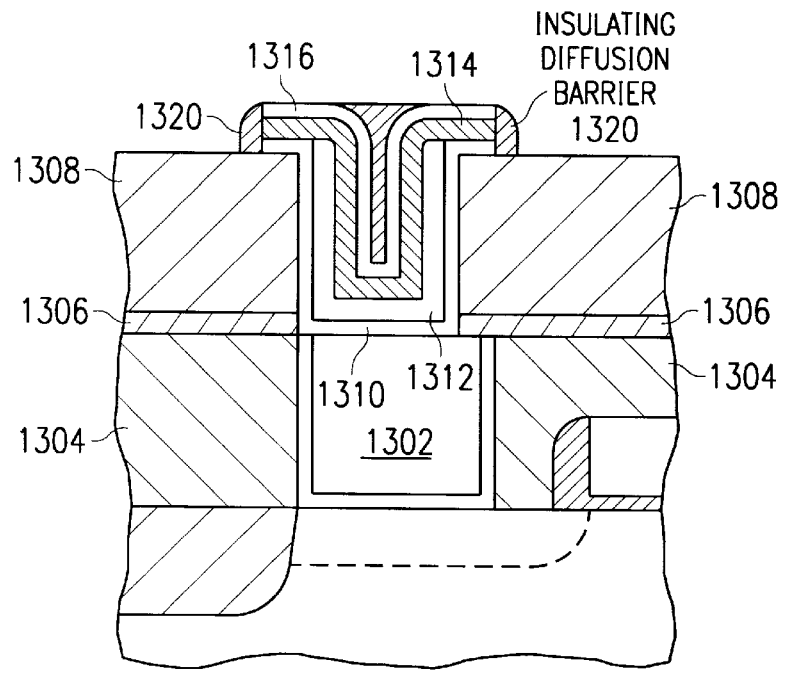
Figure 13I:
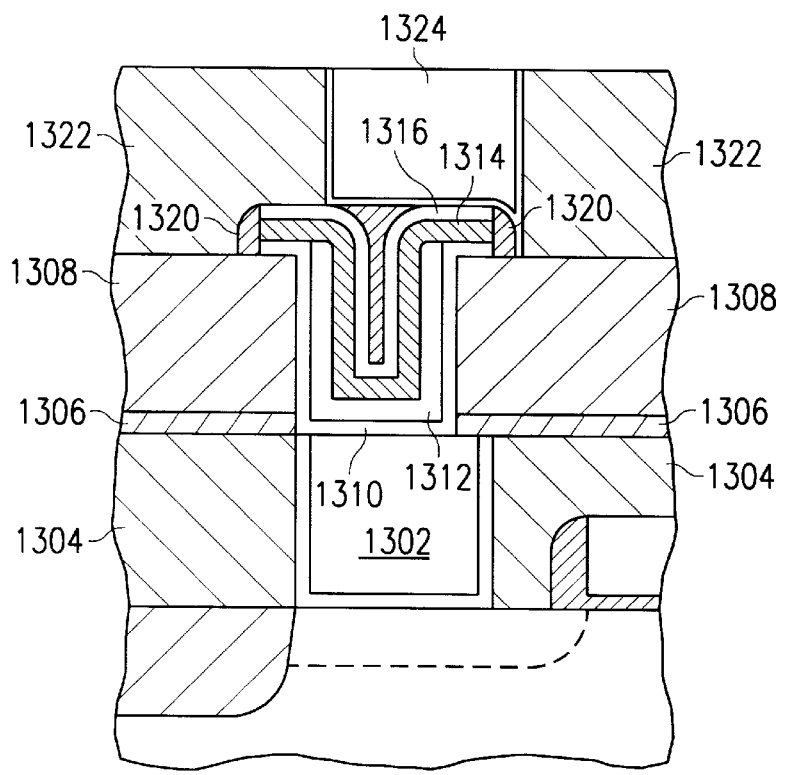

The horizontal portions of the insulating diffusion barrier are removed using a RIE etch leaving insulating diffusion barrier sidewalls 1320 along the top edge of the capacitor; see FIG. 13h. (9) ILD 1322, 300 nm thick, is then deposited using some type of gapfill approach (HDP SiO2).(10) A third mask is then used to define a contact via to top electrode 1316. A deep ultraviolet lithography process is used to define the via which is etched using an RIE approach. The etch stops on top electrode 1316. A liner is then deposited and W plug 1324 is also deposited. A W CMP step removes the horizontal metal and planarizes the structure in preparation for multi-level metallization; see FIG. 13i.

ModificationsThe preferred embodiments can be modified in various ways while retaining the features of a multistep via etch through dielectric plus insulating diffusion barrier.

What is claimed is:
1. A method of formation of a capacitor of the type of a bottom diffusion barrier, a bottom electrode, a ferroelectric, a top electrode, and a top diffusion barrier, the improvement consisting of:

etching a stack of diffusion barrier, electrode, ferroelectric, electrode, diffusion barrier materials with a plasma-activated etchant and using optical emission spectroscopy at two or more wavelengths to detect material boundaries and switch etchant composition.

2. A method of formation of a capacitor of the type of a bottom diffusion barrier, a bottom electrode, a ferroelectric, a top electrode, and a top diffusion barrier plus a sidewall diffusion barrier, the improvement consisting of:

depositing a conformal layer of diffusion barrier material over a capacitor stack of diffusion barrier, electrode, ferroelectric, electrode, diffusion barrier materials, and anisotropically removing the portions of said diffusion barrier material away from the sidewall of said capacitor stack.

3. The method of claim 2 wherein the layer of diffusion barrier material includes a sublayer of silicon nitride over a sublayer of metal oxide.

4. A method of capacitor formation of the type of forming a bottom electrode, depositing dielectric, and depositing a top electrode, the improvement consisting of:

surface oxidizing the bottom electrode after formation and prior to dielectric deposition.

* * * * *